(12) United States Patent
Ou et al.

(10) Patent No.: US 12,092,711 B2
(45) Date of Patent: Sep. 17, 2024

(54) CHANGING SAMPLES IN A MAGNETIC RESONANCE SYSTEM

(71) Applicant: Quantum Valley Investment Fund LP, Waterloo (CA)

(72) Inventors: Wei-Lin Ou, Burlington (CA); Troy W. Borneman, Waterloo (CA); Derek Blair Poirier Thompson, Waterloo (CA); Hamidreza Mohebbi, Waterloo (CA); Andrew Boorn, Waterloo (CA); Donald Edward Carkner, Waterloo (CA)

(73) Assignee: Quantum Valley Investment Fund LP, Waterloo (CA)

( * ) Notice: Subject to any disclaimer, the term of this patent is extended or adjusted under 35 U.S.C. 154(b) by 0 days.

(21) Appl. No.: 18/235,591

(22) Filed: Aug. 18, 2023

(65) Prior Publication Data

US 2024/0061057 A1 Feb. 22, 2024

Related U.S. Application Data

(60) Provisional application No. 63/399,455, filed on Aug. 19, 2022, provisional application No. 63/494,161, filed on Apr. 4, 2023.

(51) Int. Cl.
*G01R 33/31* (2006.01)
*G01R 33/30* (2006.01)
(Continued)

(52) U.S. Cl.
CPC .......... *G01R 33/31* (2013.01); *G01R 33/307* (2013.01); *G01R 33/3403* (2013.01); *G01R 33/345* (2013.01); *G01R 33/34023* (2013.01)

(58) Field of Classification Search
CPC .. G01R 33/00; G01R 33/3403; G01R 33/345; G01R 33/34023; G01R 33/31;
(Continued)

(56) References Cited

U.S. PATENT DOCUMENTS 6,768,305 B1 * 7/2004 Keifer .................. G01R 33/307
324/315
7,088,102 B1 8/2006 Zens
(Continued)

FOREIGN PATENT DOCUMENTS

WO 2022038340 2/2022

OTHER PUBLICATIONS

Kalendra, et al., "X—and Q-band EPR with cryogenic amplifiers independent of sample temperature", Journal of Magnetic Resonance 346, Dec. 9, 2022, 9 pgs.
(Continued)

*Primary Examiner* — Jermele M Hollington
*Assistant Examiner* — Taqi R Nasir
(74) *Attorney, Agent, or Firm* — Henry Patent Law Firm PLLC

(57) ABSTRACT

In a general aspect, a sample holder has multiple sample containers. In some instances, the sample holder can be received into a resonator package in a primary magnetic field of a magnetic resonance system. The resonator package includes a resonator configured to interact with a sample in a sample region. The sample holder includes a first sample and a calibration sample. The position of the sample holder relative to the resonator is calibrated. After calibrating the position of the sample holder, the sample holder is translated to position the first sample in the sample region. Magnetic resonance data is acquired based on magnetic resonance signals generated by an interaction between the resonator and the first sample.

28 Claims, 20 Drawing Sheets

(51) Int. Cl.
*G01R 33/34* (2006.01)
*G01R 33/345* (2006.01)

(58) Field of Classification Search
CPC .............. G01R 33/307; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | | |
|---|---|---|---|---|
| 2002/0063561 A1* | 5/2002 | Higgins | ............... | G01R 33/307 324/318 |
| 2003/0107444 A1* | 6/2003 | Ieki | ........................ | H05K 1/141 331/107 SL |
| 2004/0233107 A1* | 11/2004 | Popov | ................... | H01Q 9/0492 343/700 MS |
| 2007/0014695 A1* | 1/2007 | Yue | ................... | B01L 3/502707 422/400 |
| 2013/0342209 A1* | 12/2013 | Huang | ................ | G01R 33/445 324/321 |

OTHER PUBLICATIONS

Shrestha, "Non-resonant Broadband ESR Sensor for Portable Retrospective Dosimetry", Poster displayed at Rocky Mountain Conference on Magnetic Resonance, Copper Mountain, Colorado, Jul. 25-29, 2022, 1 pg.
Shrestha, et al., "Nonresonant Transmission Line Probe for Sensitive Interferometric Electron Spin Resonance Detection", Anal. Chem. 2019, Aug. 5, 2019, 8 pgs.
Simenas, et al., "A sensitivity leap for X-band EPR using a probehead with a cryogenic preamplifier", Nov. 17, 2020, 7 pgs.
Sojka, et al., "Sample Holders for Sub-THz Electron Spin Resonance Spectroscopy", IEEE Transactions on Instrumentation and Measurement, Apr. 1, 2022, 12 pgs.
EPO, Extended European Search Report issued in Application No. 23192209.7 on Dec. 20, 2023, 10 pages.
Batel, Michael, et al., "A multi-sample 94 GHz dissolution dynamic-nuclear-polarization system", Journal of Magnetic Resonance, vol. 214, Nov. 15, 2011, pp. 166-174, 9 pages.

* cited by examiner

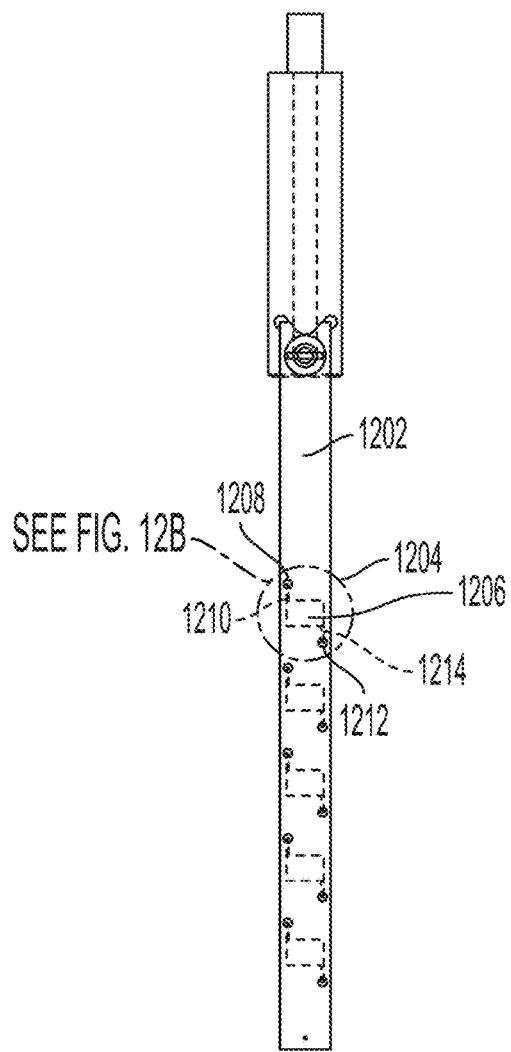
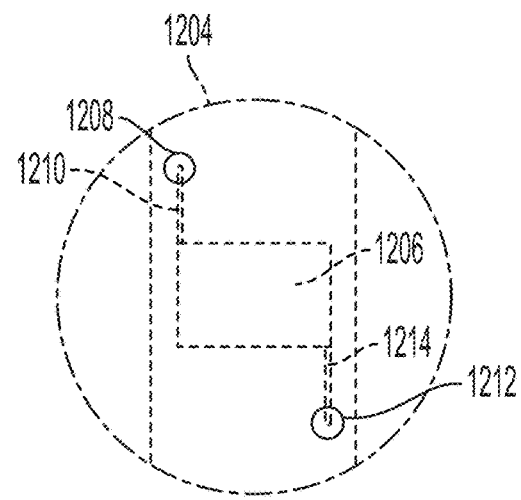
FIG. 12A
FIG. 12B

CHANGING SAMPLES IN A MAGNETIC RESONANCE SYSTEM

CROSS-REFERENCE TO RELATED APPLICATIONS

This application claims priority to U.S. Provisional Patent Application No. 63/399,455, filed on Aug. 19, 2022 and U.S. Provisional Patent Application No. 63/494,161, filed on Apr. 4, 2023. U.S. Provisional Patent Application No. 63/399,455, filed on Aug. 19, 2022 and U.S. Provisional Patent Application No. 63/494,161 are each incorporated by reference in their entirety.

BACKGROUND

The following description relates to changing samples in magnetic resonance systems.

Magnetic resonance systems are used to study various types of samples and phenomena. A resonator manipulates the spins in a sample by producing a magnetic field at or near the spins' resonance frequencies. In some cases, the resonator detects the spins based on a voltage induced by the processing spins.

DESCRIPTION OF DRAWINGS

FIG. 12A is a front view of an example sample holder illustrating sample containers with entry ports.

FIG. 12B is a detailed front view of the example sample holder of FIG. 12A.

DETAILED DESCRIPTION

Figure 1:
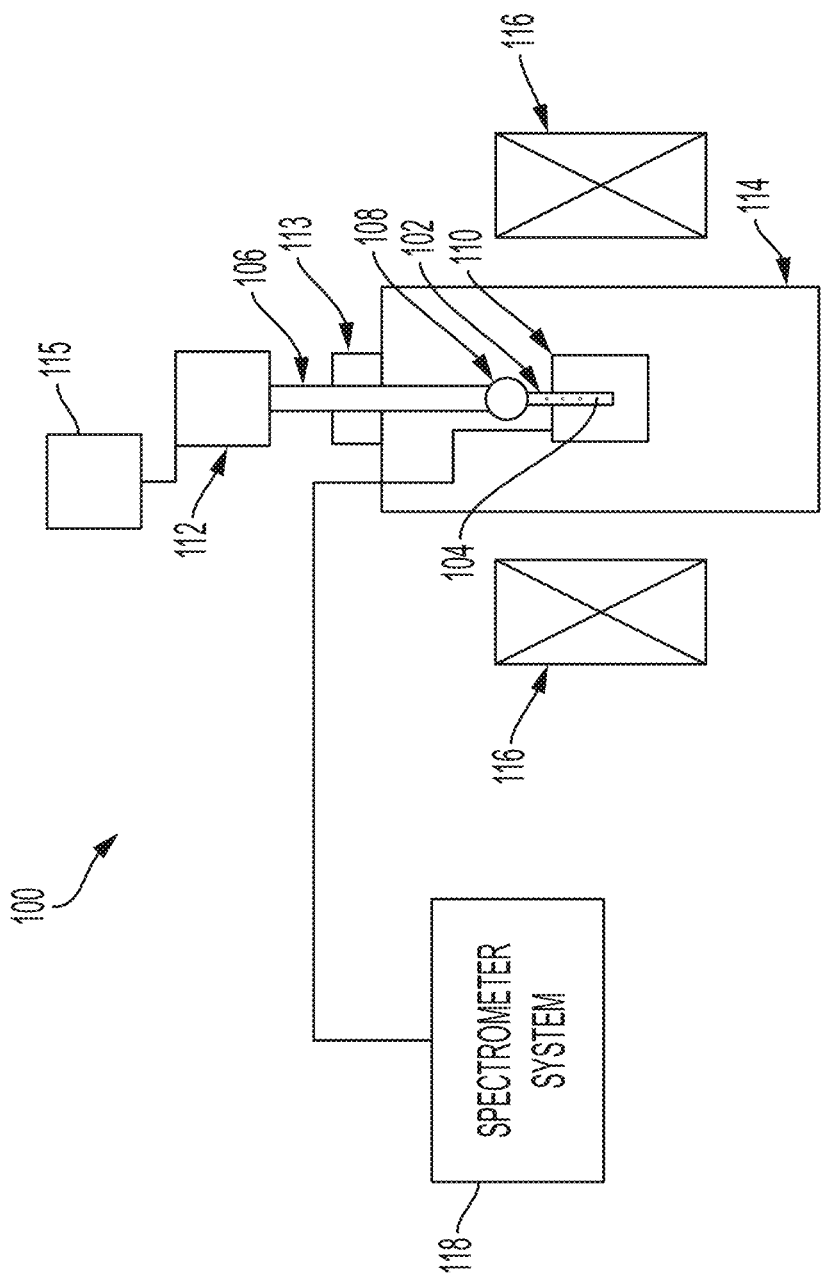
FIG. 1 is a schematic diagram of an example magnetic resonance system.

In some aspects of what is described, a magnetic resonance system includes a sample changer apparatus that can be used for changing samples. The sample changer apparatus may include a sample holder that holds multiple magnetic resonance samples. The sample holder can be a cartridge, a tubular device, cylindrical or another type of structure that has multiple sample containers. The sample changer apparatus may include additional components that operate to move the sample changer to a selected position relative to a resonator of the magnetic resonance position; for example, the sample changer apparatus may include a sample transfer device, an actuator, a control system, or a combination of these and other components. In some instances, the sample changer apparatus moves the sample holder from an external environment into a controlled environment near the resonator in the primary magnetic field of the magnetic resonance system. As such, in systems that operate at cryogenic temperatures, multiple samples can be moved together from a room temperature and pressure environment into low temperature and pressure environment, so that the samples can be cooled as a group in the controlled environment near the resonator. The sample holder can then be adjusted within the controlled environment to position any one of the samples in the sample region of the resonator. Accordingly, each of the samples can be selected and independently with no interference on their response of each other measured by the magnetic resonance system without having to remove the sample holder from the controlled environment. This can improve sample throughput of the magnetic resonance system, among other advantages.

In some implementations, one or more of the samples in the sample holder is a calibration sample. The calibration sample can be used to calibrate the position of the sample holder relative to the resonator in the controlled environment of the magnetic resonance system. For instance, the sample changer apparatus may initially position the calibration sample in the sample region of the resonator (e.g., in or adjacent to the resonator, in the magnetic control field generated by the resonator, in a region where the resonator can magnetically control spins in the calibration sample), and the sample changer apparatus may iteratively adjust the position of the sample holder relative to the resonator. In such an iterative process, the magnetic resonance system can move the sample holder through a series of test positions and acquire magnetic resonance data from the calibration sample at each of the test positions. The magnetic resonance data can be analyzed to determine a fiducial reference position for the sample holder. The fiducial reference position can be, for example, the test position where an optimal magnetic resonance signal is obtained from the calibration sample. The reference position can then be used as a datum when the sample changer apparatus subsequently moves any of the other samples into the sample region for analysis. Because each of the samples in the sample holder resides at a known location relative to the calibration sample, determining the ideal position for the calibration sample within the sample region allows each of the samples to then be precisely positioned at the ideal position for analysis. In some cases, the calibration sample can be used for other purposes, for example, to monitor system performance, etc. The calibration sample can differ from the actual sample under test and is typically chosen from materials with a well-known ESR response, such as PTM, BDPA, etc. The size of the calibration container can be also different from that of the actual sample container.

Aspects of the systems and techniques described here can be implemented in various types of magnetic resonance systems. For example, a sample changer apparatus may be implemented in a nuclear magnetic resonance ("NMR") system, an electron spin resonance ("ESR") or electron paramagnetic resonance ("EPR") system, an optically detected magnetic resonance ("ODMR"), or another type of magnetic resonance system. As another example, all or part of a sample changer apparatus may be deployed on a probe for a magnetic resonance system, or a sample changer apparatus can be deployed in a probeless magnetic resonance system. In some cases, a sample holder can be adapted to hold liquid samples, solid samples, liquid crystal samples, spin-labeled protein samples, other biological samples (e.g., blood samples, urine samples, saliva samples, etc.), or other types of samples to be measured or otherwise analyzed by a magnetic resonance system. As another example, a sample changer apparatus may be deployed with a resonator package that operates in a cryogenic environment (e.g., at 77 K, 4 K, milliKelvin, or other cryogenic temperatures below 273 K), or a sample changer apparatus may be deployed with a resonator package that operates at non-cryogenic temperatures including room temperatures. The resonator can be, for example, planar resonators (2D) such as a microstrip, coplanar waveguide, split ring, planar lumped element resonators or 3D resonators such as rectangular cavities, cylindrical cavities, birdcage, loop gap, bulk lumped element, a coil, another type of resonator for magnetic resonance systems, or a combination of the above. Additionally, the resonator could be, for example, a rectangular cavity resonator, a cylindrical cavity resonator, a dielectric resonator, a loop gap resonator, or any lumped element resonator.

In some cases, the systems and techniques presented here can be deployed in connection with various cryogenic systems, including, for example, compact closed-cycle systems, open-cycle, liquid cryogen systems and others. In some cases, the systems and techniques presented here can be deployed in connection with various probes, including compact probe designs that may enable low-noise cryogenic receiver amplifiers to be used in a variety of configurations. In some cases, the techniques and system described here can be deployed in connection with continuous wave (CW) magnetic resonance (e.g., using CW ESR spectroscopy or CW NMR spectroscopy methodology), pulse magnetic resonance (e.g., using pulsed ESR spectroscopy or pulsed NMR spectroscopy methodology), or a combination of these and other MR regimes.

In some implementations, the systems and techniques described here can provide technical advantages and improvement over existing technologies. As an example, the systems and techniques here may improve system efficiency, for instance, by reducing the amount of time that is required to change samples in a magnetic resonance system. As another example, the systems and techniques here may improve the quality of magnetic resonance data and measurements obtained by a magnetic resonance system, for instance, by allowing precise positioning of samples in the controlled operating environment of the resonator package. Moreover, conducting measurements on various samples within a single setup, utilizing the same resonator magnetic field (also known as the "B1 field") and consistent conditions, ensures a level of uniformity and precision crucial for meaningful comparisons. Other improvements and advantages may be achieved in some cases.

Aspects of the systems and techniques described here can be adapted for various types of applications. For example, the systems and techniques described here may be used for structural biology measurements, for instance, to measure structural properties of proteins or protein complexes in a biological sample (e.g., a blood sample, a urine sample, or another type of biological sample). Such measurements can be useful in clinical applications (e.g., diagnostics, treatments, etc.), pharmaceutical drug discovery/development and understanding the structure and function of membrane proteins, and other applications.

FIG. 1 is a schematic diagram of an example magnetic resonance system 100. In various implementations the magnetic resonance system 100 may be utilized, for example, in nuclear magnetic resonance ("NMR") spectroscopy, electron spin resonance ("ESR") or electron paramagnetic resonance ("EPR") spectroscopy, nuclear quadrupole resonance spectroscopy ("NQR"), magnetic resonance imaging ("MRI"), or other applications. The magnetic resonance system 100 includes a sample holder 102 that includes a plurality of sample containers 104. In various implementations, the sample holder 102 is constructed from a material that has favorable dielectric properties (e.g., low tangent loss) and that is suitable for cryogenic temperatures. In various implementations, the sample holder 102 may be constructed, for example, of quartz, sapphire, borosilicate glass, or other similar material. In the example shown in FIG. 1, the sample holder 102 is coupled to a first end of a sample transfer device 106 via an attachment mechanism 108. The sample transfer device 106 can move the sample holder 102 and position the sample holder 102 relative to a resonator 110 in the primary magnetic field of the magnetic resonance system 100. In various implementations, the resonator 110 may be enclosed in a resonator housing or another type of resonator package.

In the example shown in FIG. 1, a second end of the sample transfer device 106 is coupled to an actuator 112. In operation, the actuator 112 drives movement of the sample transfer device 106 and may, in various implementations be, for example, a single-degree-of-freedom linear actuator that translates the sample transfer device 106 in a linear fashion along an axis of the sample transfer device 106. Examples of single-degree-of-freedom linear actuators include, for example, a mechanical linear actuator, an electro-mechanical linear actuator, a linear motor, a piezoelectric actuator, a twisted and coiled polymer ("TCP") actuator, a hydraulic actuator, a pneumatic actuator, or other type of linear actuator. In various implementations, the actuator 112 could be for example, a multi-degree-of-freedom actuator such as, for example a two-degree-of-freedom actuator that moves the sample transfer device 106 in a linear fashion along two independent (e.g., perpendicular) axes. Such a two-degree-of-freedom linear actuator may, in various implementations, move the sample holder 102 along a first axis relative to the resonator 110 as well as along a second axis thereby adjusting the position of the sample holder 102 relative to the resonator 110 along the second axis. In other implementations, the actuator 112 could be, for example a three-degree-of-freedom actuator that moves the sample transfer device 106 along two linear axes and rotates the sample transfer device 106 about an axis of the sample transfer device 106. The actuator is coupled to a position control system 115 that controls operation of the actuator. In various implementations, the position control system 115 may be, for example, an automated control system such as, for example, a CNC control system, a PID control system, or other type of controller. In some cases, the position control system 115 may include, or may be implemented as, software or firmware running on a computer system (e.g., a microprocessor or another type of data processing apparatus). In some instances, the control mechanism may be a manual control such as, for example, a caliper, micrometer or hand crank. This can be further enhanced by incorporating a laser indicator.

In the example shown in FIG. 1, the resonator 110, the sample holder 102, the attachment mechanism 108, and the first end of the sample transfer device 106 are disposed in a controlled environment that is cooled by the cooling system 114, while the second end of the of the sample transfer device 106 is disposed outside controlled environment. The sample transfer device 106 is introduced to the cooling system 114 via an insertion point 113. In various embodiments, the insertion point 113 can be or include a valve, a load lock system, or another type of component that provides environmental isolation. For example, in various implementations, the insertion point 113 may provide a vacuum-pressure environment or a low pressure gas seal between a controlled environment within the cooling system 114 and a room temperature environment. In various implementations, the vacuum-pressure environment may be milli-Torr pressure. In various implementations, the cooling system 114 maintains a cryogenic thermal environment for the resonator 110 and the sample holder 102. In some cases, the cooling system 114 can maintain a cryogenic temperature of the resonator 110 and the sample holder 102. In the example shown in FIG. 1, the cooling system 114 resides in thermal contact with the resonator 110 and the sample holder 102. In some cases, the cooling system 114 cools to liquid helium temperatures (e.g., approximately 4 Kelvin), liquid nitrogen temperatures (e.g., approximately 77 Kelvin), or at another cryogenic temperature. In some cases, the cooling system 114 includes a dry cryostat. In some cases, the cooling system 114 can be implemented with or without the use of liquid cryogens, for example, as a continuous flow helium or nitrogen cryostat (e.g., 4-300 Kelvin), as a variable temperature pulsed-tube refrigerator (e.g., 3.5-300 Kelvin), a pumped helium cryostat (e.g., 1-10 Kelvin), a helium-3 refrigerator (e.g., 250-400 milliKelvin), a dilution refrigerator (e.g., 5-100 milliKelvin), or another type of system or combination of systems. In some implementations, the resonator 110 and the sample holder 102 are both held at cryogenic temperatures. In some cases, the resonator 110 and the sample holder 102 are immersed in a cryogenic liquid or a cryogenic gas, and may be held in a vacuum-pressure environment during operation. In some cases, the sample holder 102, the resonator 110, or both are held at a higher temperature (e.g., room temperature, etc.).

In the example shown in FIG. 1, a primary magnet system 116 generates a primary magnetic field that the resonator 110 and the sample holder 102 are exposed to during operation. In various implementations, the primary magnet system 116 may be located within the cooling system 114 or outside of the cooling system 114. The primary magnet system 116 generates a magnetic field in the controlled environment of the resonator 110 and the sample holder 102. The example primary magnet system 116 shown in FIG. 1 can be implemented as a superconducting solenoid, an electromagnet, a permanent magnet or another type of magnet that generates the primary magnetic field. In various implementations, the magnetic field is homogeneous over the volume of a sample region defined by the resonator 110. In some instances, a gradient system generates one or more gradient fields that spatially vary over the sample volume. In some cases, the gradient system includes multiple independent gradient coils that can generate gradient fields that vary along different spatial dimensions of the sample region.

In the example shown in FIG. 1, a spin ensemble in the sample region of the resonator 110 interacts with the resonator 110. The primary magnetic field generated by the primary magnet system 116 quantizes the spin states and sets the Larmor frequency of the spin ensemble. Control of the spin magnetization can be achieved, for example, by a radio-frequency or microwave magnetic field generated by the resonator 110. In the example shown in FIG. 1, the spin ensemble can be any collection of particles having non-zero spin that interact magnetically with the applied fields of the magnetic resonance system 100. For example, the spin ensemble can include nuclear spins, electron spins, or a combination of nuclear and electron spins. Examples of nuclear spins include hydrogen nuclei ($^1$H), carbon-13 nuclei ($^{13}$C), and others. In some implementations, the spin ensemble is a collection of identical spin-1/2 free electron spins attached to an ensemble of large molecules.

In the example shown in FIG. 1, the resonator 110 is electrically coupled to a spectrometer system 118. In various implementations, the spectrometer system 118 acquires magnetic resonance data based on magnetic resonance signals generated by an interaction between the resonator 110 and magnetic resonance samples contained in the sample holder 102. Typically, the resonator 110 has one or more resonance frequencies and possibly other resonance frequencies or modes. The drive frequency can be tuned to the spins' resonance frequency, which is determined by the strength of the primary magnetic field and the gyromagnetic ratio of the spins.

The example spectrometer system 118 can control the resonator 110 and possibly other components or subsystems in the magnetic resonance system 100 shown in FIG. 1. The spectrometer system 118 is electromagnetically coupled to (e.g., by coaxial cables, etc.), and adapted to communicate with, the resonator 110. For example, the spectrometer system 118 can be adapted to provide a voltage or current signal that drives the resonator 110; the spectrometer system 118 can also acquire a voltage or current signal from the resonator 110.

In some cases, the spectrometer system 118 includes or is connected with a controller, a waveform generator, an amplifier, a transmitter/receiver switch, a receiver, a signal processor, and possibly other components. A spectrometer system 118 can include additional or different features (e.g., a gradient waveform generator, and gradient electronics, etc.). In the example shown in FIG. 1, the spectrometer system 118 is adapted to communicate with, and may operate based on inputs provided by, one or more external sources, for example, a computer system or another source.

In some cases, the spectrometer system 118 may operate in multiple modes of operation. In one mode of operation, the spectrometer system 118 generates control signals (e.g., radio frequency signals, microwave signals, etc.) that are delivered to the resonator 110 to control the spin system in the sample. In another mode of operation, the spectrometer system 118 acquires magnetic resonance signals from the resonator 110. The magnetic resonance signals can be processed (e.g., digitized) and provided to a computer system for analysis, display, storage, or another action. The computer system may include one or more digital electronic controllers, microprocessors or other types of data-processing apparatus. The computer system may include memory, processors, and may operate as a general-purpose computer, or the computer system may operate as an application-specific device.

Figure 2:
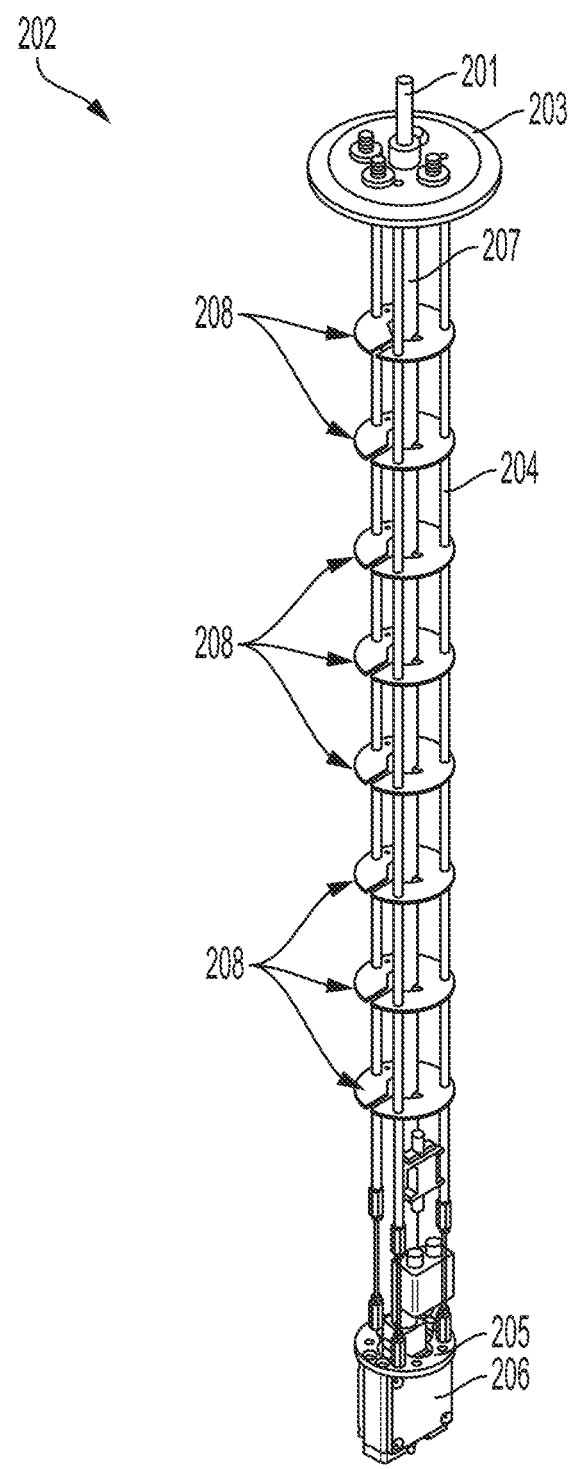
FIG. 2 is a perspective view of an example probe for use in a magnetic resonance system.

FIG. 2 is a perspective view of an example probe 202 that, in various implementations, may be used in the magnetic resonance system 100 or another type of system. The probe 202 includes a linear support element 204 that extends from an anchor plate 203 located on an external surface or access point of a cooling system (e.g., the cooling system 114 in FIG. 1) to a support plate 205. In various implementations, the probe 202 may include a plurality of linear support 204 elements such as, for example, two elements, three elements, or more. Thermal baffles 208 are coupled to the linear support element 204 and provide thermal insulation between the cryogenic thermal environment provided by the cooling system and an external ambient environment. In various implementations, the probe 202 may include a plurality of thermal baffles 208 such as, for example, two thermal baffles 208, three thermal baffles 208, or more.

In the example shown in FIG. 2, a sample transfer arm 201 extends through the anchor plate 203 and through the thermal baffles 208 in a manner generally parallel to the linear support element 204. The sample transfer arm 201 is disposed within a guide tube 207. In various implementations, the sample transfer arm 201 is an elongated rod or another type of structure constructed of a material with a low thermal conductivity and low coefficient of thermal expansion. In various implementations, the sample transfer arm 201 may be formed of, for example, a high-pressure fiberglass impregnated with epoxy resin such as, for example, G-10 fiberglass laminate. A sample holder (e.g., the sample holder 102 shown in FIG. 1) is coupled to the first end of the sample transfer arm 201. A resonator package 206 containing a resonator (e.g., the resonator 110 shown in FIG. 1) is coupled to the support plate 205 opposite the linear support element 204.

Figure 3:
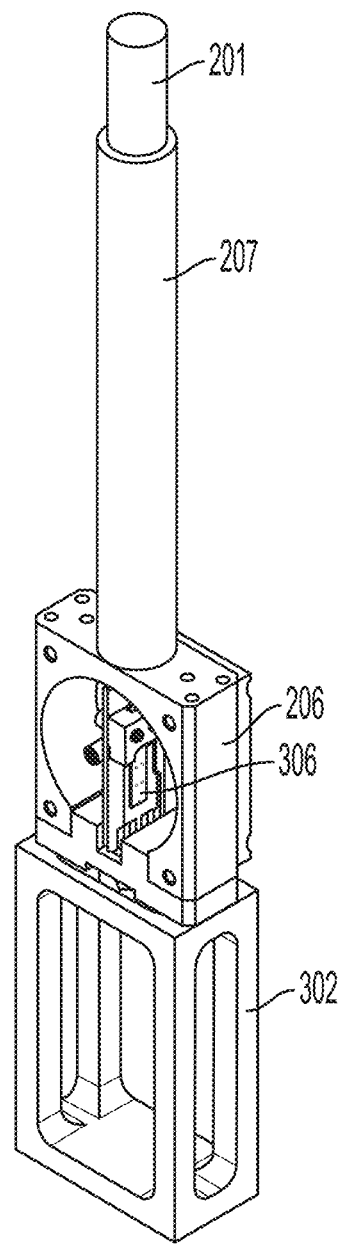
FIG. 3 is a perspective view of an example probeless magnetic resonance package.

FIG. 3 is a perspective view of the example resonator package 206 in a probeless magnetic resonance system. In various implementations, the resonator package 206 is coupled to a mounting structure 302. The mounting structure 302 is disposed within a cooling system (e.g., the cooling system 114 shown in FIG. 1) and provides a fixed location of the resonator package 206. In various implementations, the mounting structure 302 is constructed of a material having a high thermal conductivity and provides cooling of the resonator package 206 through galvanic contact. Additionally, the mounting structure 302 may be used to position the resonator package in three-dimensional space relative to the primary magnetic field. The sample mount should feature an empty space at its center, allowing ample room for the sample holder to be removed through the bottom slot of the resonator package. In various implementations, such positioning may be accomplished using for example linear actuators, rotary actuators, or a combination of linear actuators and rotary actuators. The sample transfer arm 201 extends through the guide tube 207 from the resonator package 206 to outside the cryogenic thermal environment. For purposes of illustration, FIG. 3 the resonator package 206 is illustrated without the cover so that a position of an example sample holder 306 is visible. Thus, in the arrangement shown in FIG. 3, the linear support structure 204 and the thermal baffle 208 are omitted.

Figure 4:
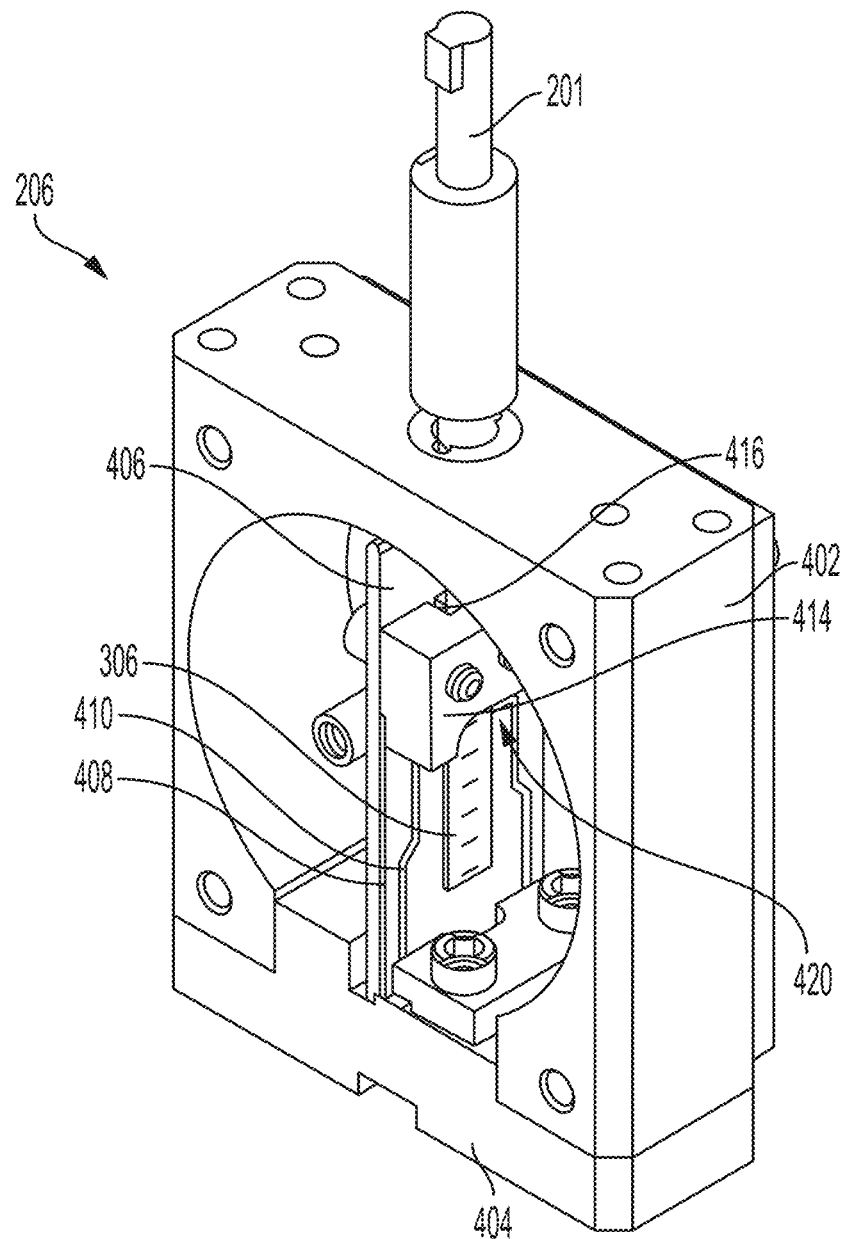
FIG. 4 is a perspective view of an example resonator package.

FIG. 4 is a perspective view of the example resonator package 206. In the view shown in FIG. 4, a cover of the resonator package 206 has been removed so that an example resonator chip 420 and the sample holder 306 are visible. The example resonator package 206 includes a housing 402 and a package insert 404. A resonator floor 406 is cantilevered from the package insert 404. In various implementations, the resonator floor 406 is constructed of an electrically conductive material such as, for example, copper or other electrically conductive material. This choice ensures a solid electrical ground for the resonator. The resonator chip 420 is coupled to a face of the resonator floor 406. The resonator chip 420 includes a dielectric substrate 408, a ground plane (not shown) on a first side of the substrate 408 contacting the resonator floor 404, and conductors 410 on a second, opposite side of the substrate 408. In various implementations, a resonator may include additional or different features, and the components of a resonator may be arranged as shown in FIG. 4 or in another manner.

In the example shown in FIG. 4, the dielectric substrate 408 may be constructed of dielectric material such as, for example, sapphire, silicon, $MgO_2$, $LaAlO_3$, or another type of non-magnetic dielectric crystalline material. In some implementations, the conducting material on the dielectric substrate (e.g., the ground plane, the conductors 410, etc.) can be made of non-superconducting material (e.g., gold, copper, or other conducting material), superconducting material (e.g., niobium, niobium titanium, niobium nitride, aluminum, yttrium barium copper oxide (aka, "YBCO"), magnesium diboride) or a combination of them. Also, enhancements to the resonator's behavior can be achieved through the implementation of various techniques. Such techniques include utilizing composite layers, multilayer films composed of distinct superconducting materials along with normal conducting materials, or incorporating arrays of holes, slots, dielectric, or metallic centers. In various implementations, the conducting materials may be deposited on the substrate 408 by deposition processes or other types of fabrication processes. In various implementations, the substrate 408 may be etched or otherwise conditioned based on standard fabrication processes.

In some implementations, the ground plane and the conductors 410 may be implemented as thin films on opposite sides of the dielectric substrate 408. In the example shown in FIG. 4, the ground plane and the conductors 410 define a microstrip transmission line structure. Generally, a microstrip transmission line structure can include any conducting material (non-superconducting material or superconducting material) on a first surface of a dielectric substrate separated from a ground plane on the opposite surface of the dielectric substrate.

In the example shown in FIG. 4, the example sample holder 306 is coupled to the sample transfer arm 201. During operation, the sample transfer arm 201 translates the sample holder 306 into the housing 402 such that one of the sample containers formed on the sample holder 306 is positioned in a sample region 502 (shown in FIG. 5) that is defined by the resonator 420. A toe clamp 414 is attached to the resonator floor 406 and includes a slot 416 formed therein. During operation, the sample holder 306 is received through the slot 416. Thus, during operation, the toe clamp 414 overhangs a surface of the resonator chip 420 and facilitates proper alignment in two dimensions of the sample holder 306 relative to the resonator chip 420. In some cases, to ensure controlled elevation of the sample container in relation to the resonator, mechanical elements such as pedestals or tensioners (metallic or dielectric) may be employed.

Figure 5:
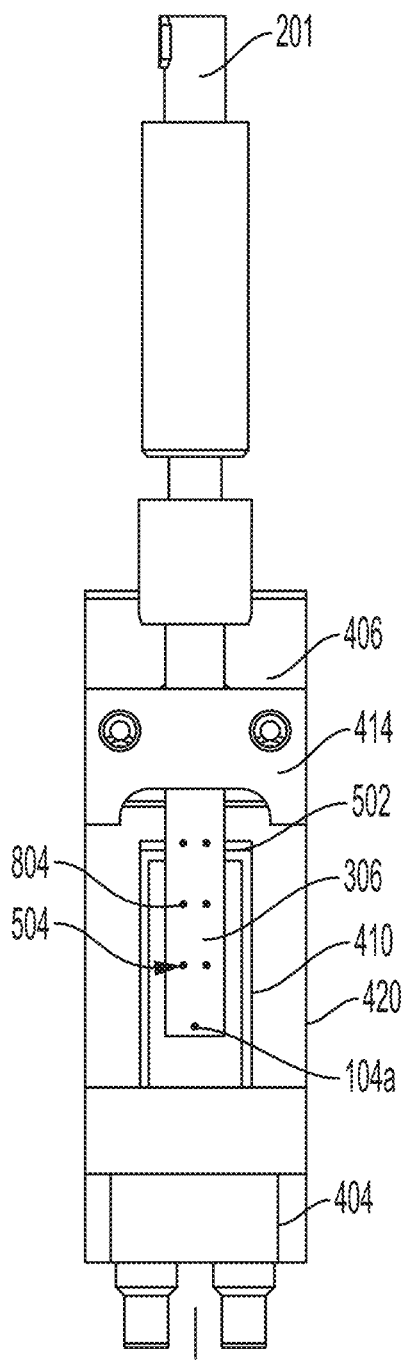
FIG. 5 is a plan view of an interior of an example resonator package illustrating an example sample holder and an example resonator.

FIG. 5 is a plan view of the example resonator package 206 with the housing 402 removed to show structural features. As shown, the resonator floor 406 extends upwardly from the package insert 404. The resonator chip 420 is coupled to the resonator floor 406. The conductors 410 are formed on a surface of the resonator chip 420. In the example illustrated in FIG. 5, the conductors 410 form a planar conductive path; however, in other implementations, the conductors 410 may be any shape and, in some cases, may be non-planar. For example, in various implementations, the conductors 410 may form a coiled or birdcage type resonator.

In the example shown in FIG. 5, a microstripline resonator of the resonator chip 420 defines a sample region of the resonator chip 420. The sample region of the resonator chip 420 is illustrated schematically in FIG. 5 by line 502. In various implementations, a sample may be positioned in the sample region 502 to increase or maximize a filling factor. A magnetic field generated by the resonator 420 may be described by a vector of $B_1$ field strengths at arbitrary points in three-dimensional space $\vec{r}=x\hat{x}+y\hat{y}+z\hat{z}$ according to the following equation.

$$\vec{B_1}(\vec{r})=B_1(x)\hat{x}+B_1(y)\hat{y}+B_1(z)\hat{z}$$

The filling factor is a dimensionless parameter that describes how much of the total magnetic energy of the resonator field is contained in the sample and may be computed according to the following equation.

$$h = \frac{\int_{sample} |\vec{B_{IT}}(\vec{r})|^2 dV}{\int_{space} |\vec{B_1}(\vec{r})|^2 dV}$$

Where $\vec{B_{IT}}(\vec{r})=B_1(x)\hat{x}+B_1(y)\hat{y}$. In general, the filling factor may be computed by simulation of the spatial field profile of the resonator 420, which is expressed as $\vec{B_1}(\vec{r})$.

In the example shown in FIG. 5, the sample holder 306 is coupled to the sample transfer arm 201. Actuation of the sample transfer arm 201 facilitates movement of the sample holder 306 relative to the sample region 502 defined by the microstripline resonator such that a select sample container 504 may be aligned with the sample region 502 of the resonator 420. The toe clamp 414 facilitates accurate alignment of the sample holder 306 with the resonator chip 420.

During operation, each one of the sample containers 504 formed in the sample holder 306 contains a sample for magnetic resonance analysis. Movement of the sample holder 306 via actuation of the sample transfer arm 201 allows one sample container 504 at a time to be positioned in the sample region 502 of the resonator. A calibration sample container 104A may contain a calibration sample. When the calibration sample is positioned in the sample region 502, the positioning of the sample holder 306 relative to the resonator may be calibrated. When calibration is complete, the sample holder 306 is moved such that another sample container 504, containing a sample for analysis, is positioned in the sample region 502 of the resonator. Upon completion of magnetic resonance analysis of one sample, the sample holder 306 is moved again to position a different sample container 504 for analysis of a different sample. Thus, the sample holder 306 facilitates calibration and testing of multiple samples at cryogenic temperatures without the need to remove the samples from the cryogenic thermal environment. Such an arrangement increases throughput of magnetic resonance analysis.

Figure 6A:
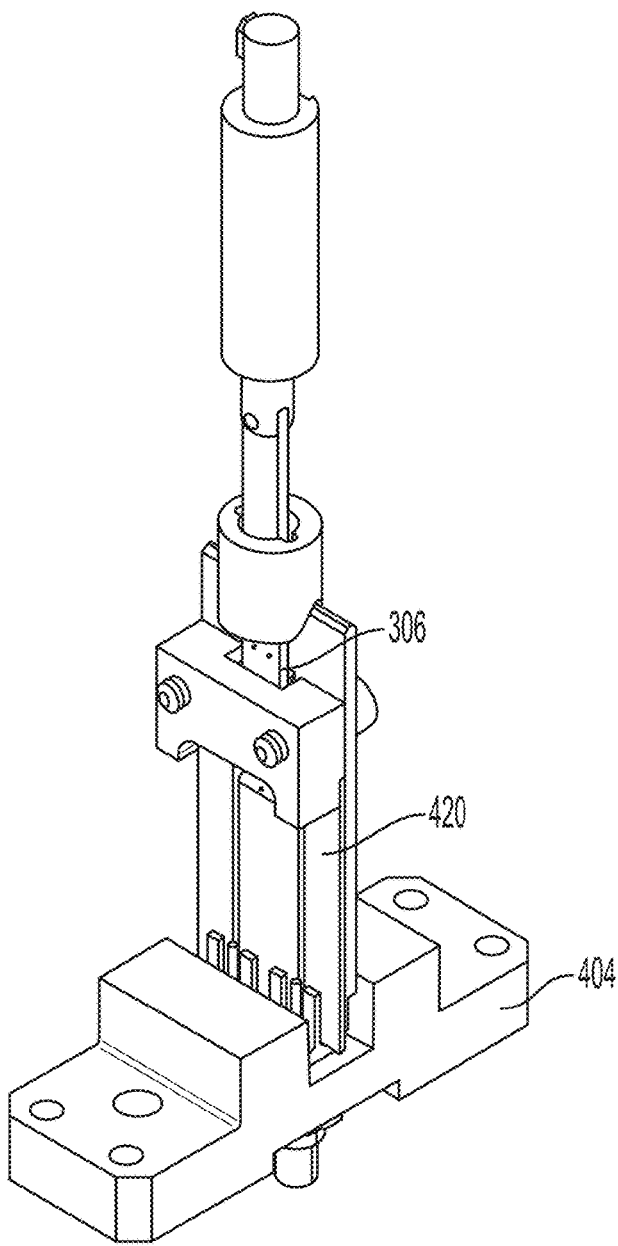
FIGS. 6A-6B are perspective views of an example resonator illustrating positioning of a sample holder relative thereto.
Figure 6B:
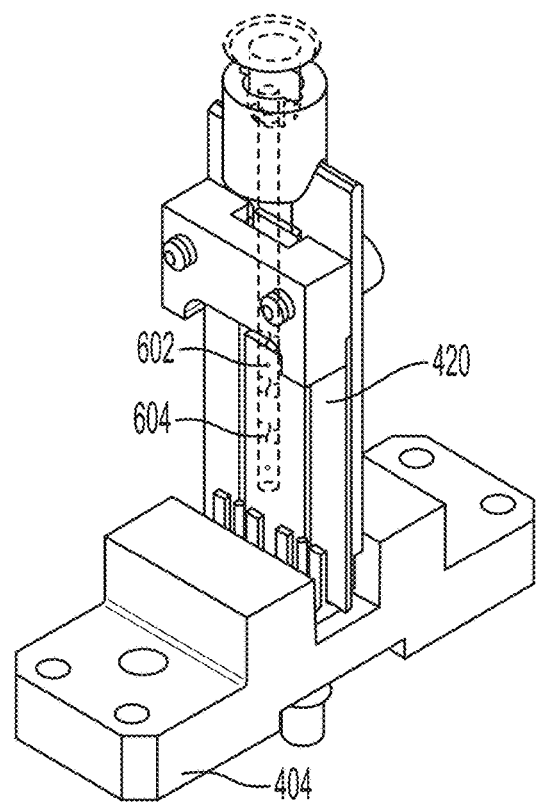

FIGS. 6A-6B are perspective views of the resonator 420 illustrating positioning of a sample holder relative thereto. FIG. 6A illustrates the sample holder 306 in a first position where the sample container 504 (shown in FIG. 5) containing the calibration sample is positioned in the sample region 502 (shown in FIG. 5). Additionally, FIG. 6A illustrates that the sample holder 306 may, in various implementations, be an elongated prismatic body with a plurality of planar exterior surfaces. In such an implementation, the sample containers 504 can be implemented as channels formed in one of the planar exterior surfaces. FIG. 6B illustrates another example sample holder 602 in a second position where a sample container 604 may be aligned with the sample region 502 of the resonator 420. FIG. 6B also illustrates that, in some implementations, the sample holder 602 may be, for example, an elongated cylindrical body that defines a lateral surface and that the sample containers 604 are channels defined in the lateral surface.

Figure 7:
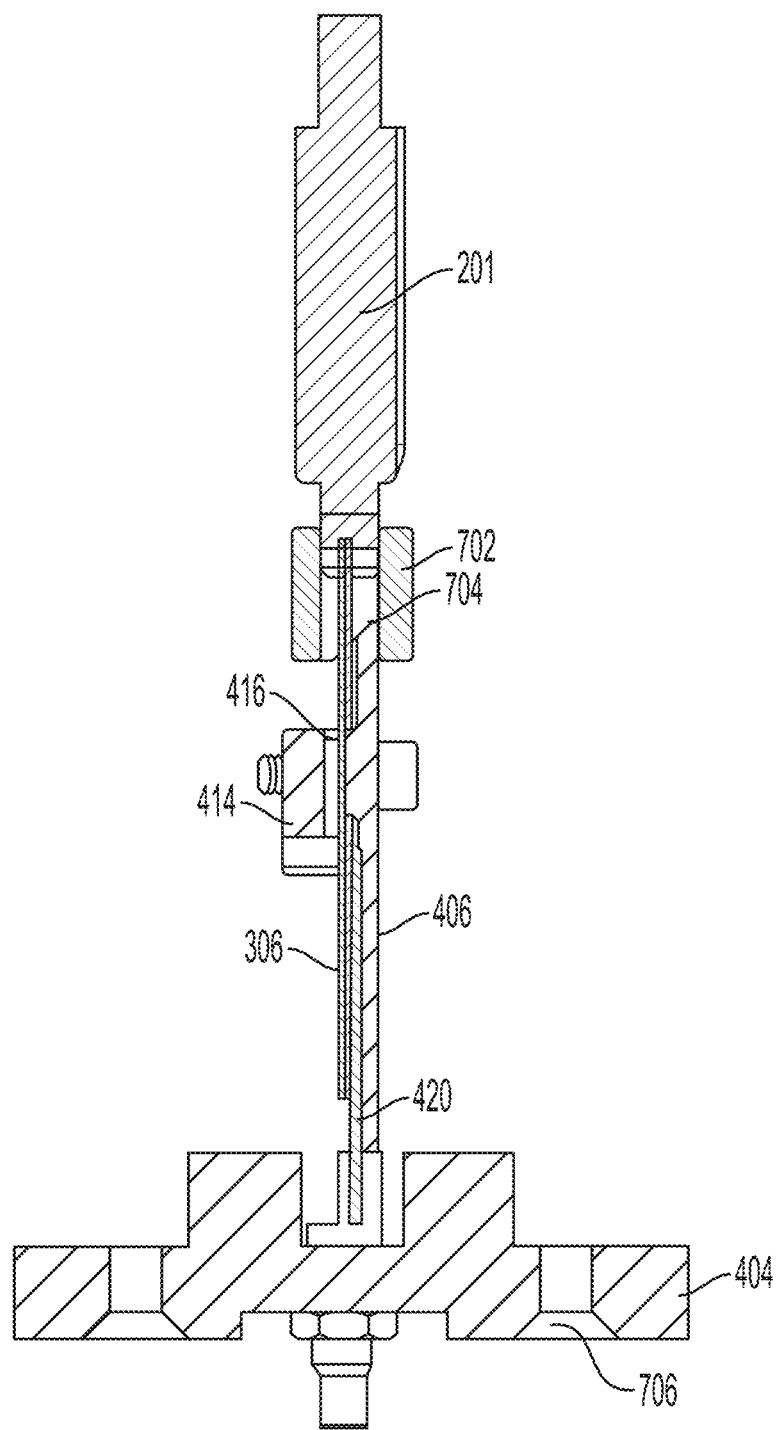
FIG. 7 is a cross-sectional view of an example resonator and an example sample holder.

FIG. 7 is a cross-sectional view of the example package insert 404 illustrating the resonator 420 and the sample holder 306. As shown in FIG. 7, the resonator floor 406 is cantilevered from the package insert 404. The resonator chip 420 is disposed on a surface of the resonator floor 406. The sample holder 306 is received through the toe clamp 414 and positioned adjacent to the resonator chip 420 by the sample transfer arm 201. The sample transfer arm 201 passes the sample holder 306 through a positioning guide 702 that is disposed in a surface of the housing 402 (shown in FIG. 4) opposite the package insert 404. The positioning guide 702 may be cylindrical in shape and includes a notch 704 formed in a bottom edge. When assembled, the notch 704 engages a cantilevered edge of the resonator floor 406. Such an arrangement stabilizes the free edge of the resonator floor 406. During assembly of the resonator package 206 (shown in FIG. 4), the package insert 404 is assembled to the housing 402 via, for example, screws that are received through apertures 706. During assembly, the positioning guide 702 is removed from the housing 402 in an effort to prevent damage to the resonator floor 406 or the resonator chip 420. After the package insert 404 is assembled to the housing 402, the positioning guide 702 is inserted thereby securing the free edge of the resonator floor 406.

In the example shown in FIG. 7, interaction of the notch 704 with the resonator floor 406 and interaction of the sample transfer arm 201 with the positioning guide 702 ensures proper spacing between the sample holder 306 and the resonator chip 420. In various implementations, the toe clamp 414 may include an actuatable compression element (not explicitly shown) that presses the sample holder 306 towards the resonator chip 420 during magnetic resonance data acquisition. In various implementations, the compression element may be, for example, a wedge element that is received into the slot 416 formed in the toe clamp 414 and presses the sample holder 306 into engagement with the resonator chip 420. In various implementations, the compression element may be mechanically actuated, electrically actuated, or a combination of the two. In other implementations, the compression element may be, for example, hydraulically actuated, pneumatically actuated, or piezoelectric.

Figure 8:
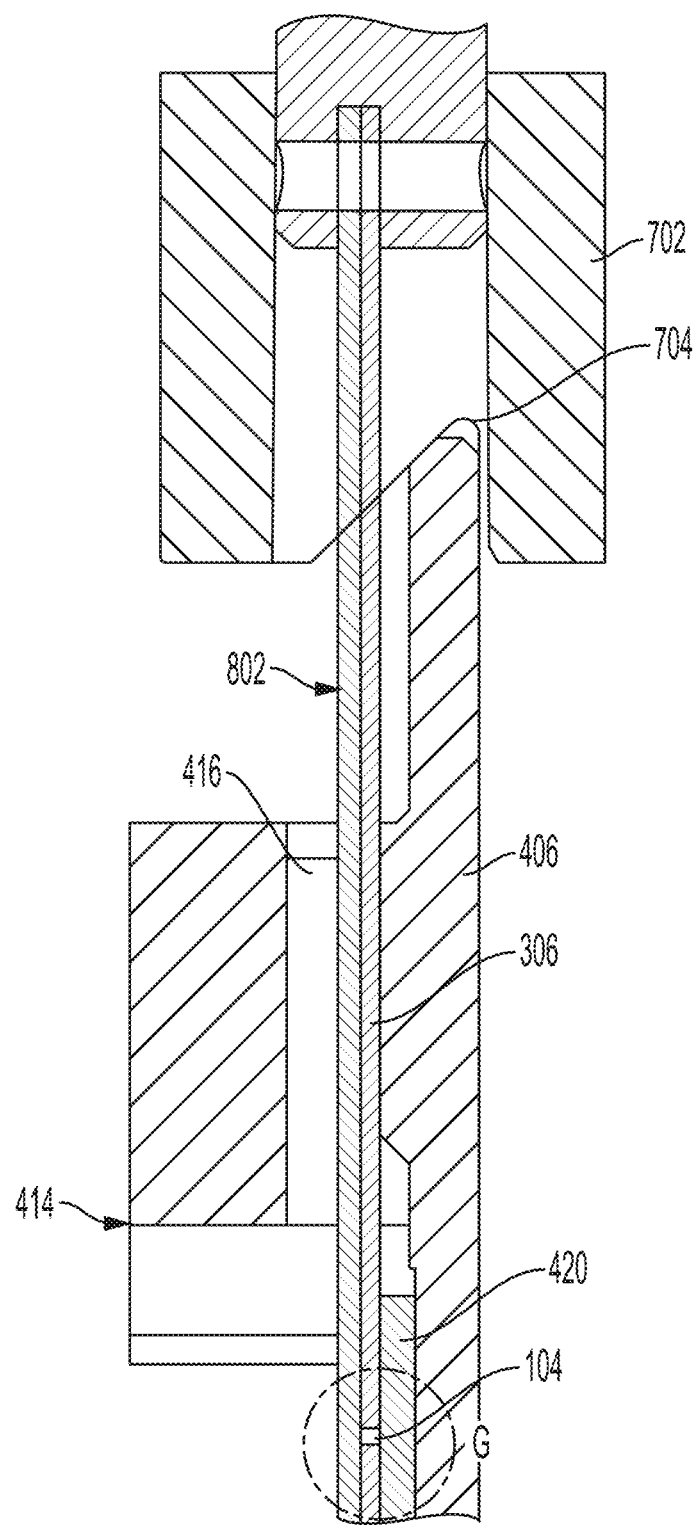
FIG. 8 is a detailed cross-sectional view of an example resonator package showing an example positioning guide.

FIG. 8 is a detail view of the positioning guide 702, the resonator floor 406, the sample holder 306, and the resonator 420. The notch 704 formed in the positioning guide 702 secures the free end of the resonator floor 406. This facilitates positioning of the resonator floor 406 and helps ensure that, when the sample holder 306 is received into the positioning guide 702, the sample holder is properly spaced from the resonator 420. The toe clamp 414 also ensures proper positioning of the sample holder 306 relative to the resonator 420. As shown in FIG. 8, in various implementations, a cover slip 802 is used in conjunction with the sample holder 306. The cover slip 802, is placed over the sample holder 306 and seals the sample containers 504 thereby preventing escape of the samples contained therein. A plurality of ports 804 may be formed in the cover slip 802. The ports 804 provide fluid communication to the sample containers 504 and allow loading of liquid samples in the sample containers 504 without removal of the cover slip 802. In various implementations, the ports 804 may be plugged or sealed, for example, with adhesive, wax, or another material with no magnetic resonance signal after a sample has been loaded into the sample container 504. Sealing of the ports 804 prevents loss of the sample via, for example, evaporation or other mechanisms.

Figure 9B:
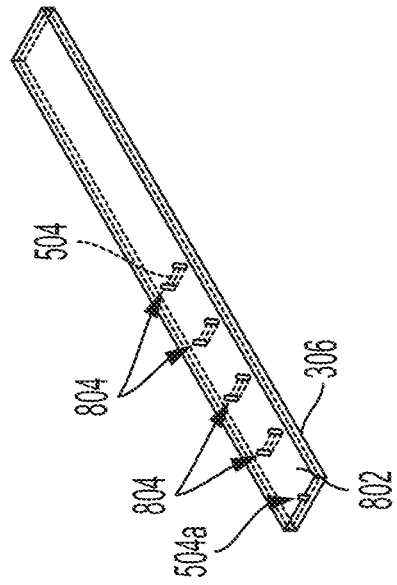
FIG. 9B is a perspective view of the sample holder of FIG. 9A.
Figure 9D:
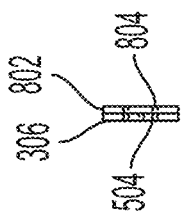
FIG. 9D is an end view of the sample holder of FIG. 9A.
Figure 9A:
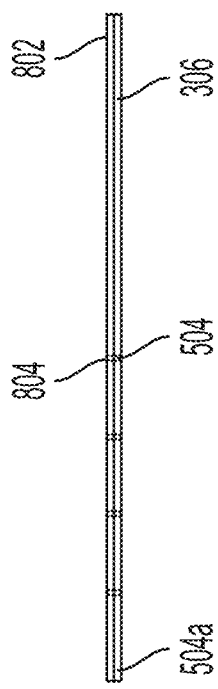
FIG. 9A is a side view of an example sample holder.
Figure 9C:
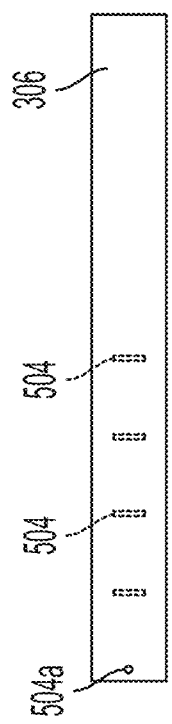
FIG. 9C is a top view of the sample holder of FIG. 9A.

FIG. 9A is a side view of the sample holder 306. FIG. 9B is a perspective view of the sample holder 306. FIG. 9C is a plan view of the sample holder 306. FIG. 9D is an end view of the sample holder 306. In the example shown in FIGS. 9A-9D, the sample holder 306 is a prismatic body having a plurality of planar surfaces, and the sample containers 504 are formed in one of the planar surfaces. In various embodiments, the sample containers 504 may incorporate 3D contouring to improve spectral fidelity. One of the sample containers 504A contains a calibration sample that is used in calibrating the positioning of the sample holder 306 relative to the resonator 420. In various implementations, the sample holder 306 may be bar-coded, or otherwise marked, to verify authenticity and identify the specific calibration sample that is contained in the sample container 504A. The sample containers 504 are spaced from each other a known distance. In various implementations, the sample containers 504 may be spaced a uniform distance from each other, or they may be spaced apart in another arrangement. The sample containers 504 are spaced from each other such that adjacent samples do not interfere electromagnetically with the sample under measurement. Such known spacing between the sample containers 504 allows the sample container 504A, which contains the calibration sample, to be positioned in the sample region 502 (shown in FIG. 5) for calibration of the position of the sample holder 306 relative to the resonator 420.

During calibration, the position of the sample holder 306 may be adjusted via actuation of the sample transfer arm 201 by the actuator (e.g., the actuator 112 shown in FIG. 1) such that the optimum signal is obtained from the calibration sample contained in the sample container 504A. For instance, the sample holder 306 may be adjusted to determine a position where magnetic resonance data from the calibration sample meets one or more calibration criteria or optimization metrics. In various implementations, this position is used as a reference datum to move to the other sample containers 504 in the sample holder 306. After completion of calibration, the sample holder 306 may be moved to position another sample container 504 in the sample region 502 in order to conduct magnetic resonance analysis of a first sample. In various implementations, the calibration sample contained in the sample container 504A may also allow monitoring of performance of the magnetic resonance system, for example, by comparing results with those from factory tests of the same calibration sample. After completing the magnetic resonance analysis of the first sample, the sample holder 306 may again be moved to position a different sample container 504 in the sample region 502 in order to complete magnetic resonance analysis of a second sample. After completing magnetic resonance analysis of the second sample, the sample holder 306 may again be moved relative to the resonator 420 in order to conduct magnetic resonance analysis on a third sample. This process may be performed iteratively until all samples contained in the sample holder 306 have been analyzed.

In the example shown in FIGS. 9A-9D, the cover slip 802 may, in some implementations, be used in conjunction with the sample holder 306. In such implementations, the cover slip 802 is placed over the sample holder 306 so as to cover the sample containers 504. In some implementations, the cover slip 802 may be bonded to the sample holder 306 via, for example, a chemical adhesive. In other implementations, the cover slip 504 and the sample holder 306 may remain separable.

Figure 10A:
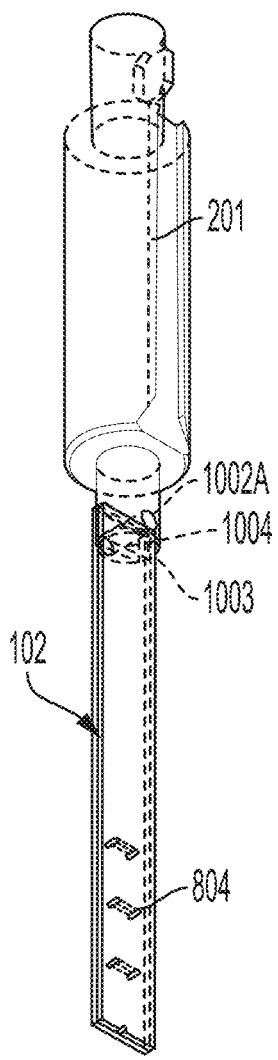
FIG. 10A is a perspective view illustrating attachment of an example sample holder to a transfer arm.

FIG. 10A is a perspective view illustrating one possible attachment method of the prismatic sample holder 102 to a transfer arm 201. An aperture 1002A is formed in an upper aspect of the sample holder 102 and a corresponding aperture is formed in the sample transfer arm 201 at the attachment point. A notch 1003A is formed in a bottom surface of the sample transfer arm 201. The notch 1003A receives a proximal end of the sample holder 102. When the sample holder 102 is received into the notch 1003A, a threaded member such as, for example, a set screw 1004 can be utilized to secure the sample holder 102 to the sample transfer arm 201. The principles discussed relative to FIG. 10A may be applied to any implementation of a sample holder described in this disclosure such as, for example, the sample holder 102, 306, 602, 1202, 1402, 1450, 1501, or another sample holder.

Figure 10B:
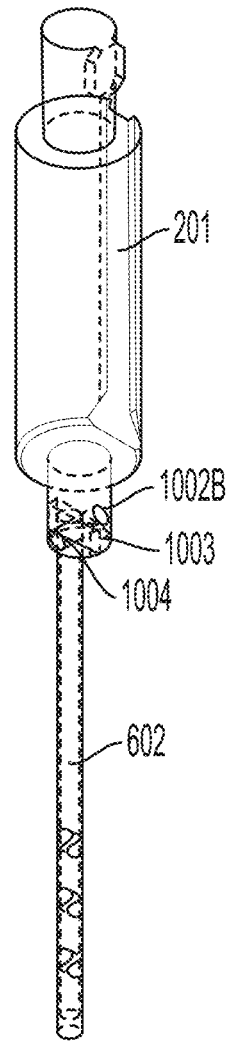
FIG. 10B is a perspective view illustrating attachment of an example tubular sample holder to a transfer arm.

FIG. 10B is a perspective view illustrating attachment of the tubular sample holder 602 to a transfer arm 201. An aperture 1002B is formed in an upper aspect of the sample holder 602 and a corresponding aperture is formed in the sample transfer arm 201 at the attachment point. A notch 1003B is formed in a bottom surface of the sample transfer arm 201. The notch 1003B receives a proximal end of the sample holder 602. When the sample holder 602 is received into the notch 1003A, a threaded member such as, for example, a set screw 1004 can be utilized to secure the sample holder 602 to the sample transfer arm 201. As illustrated in FIGS. 10A-B and FIGS. 6A-B, the sample holder may incorporate utilize different shapes and forms and is not limited to the form and shape described herein.

Figure 11A:
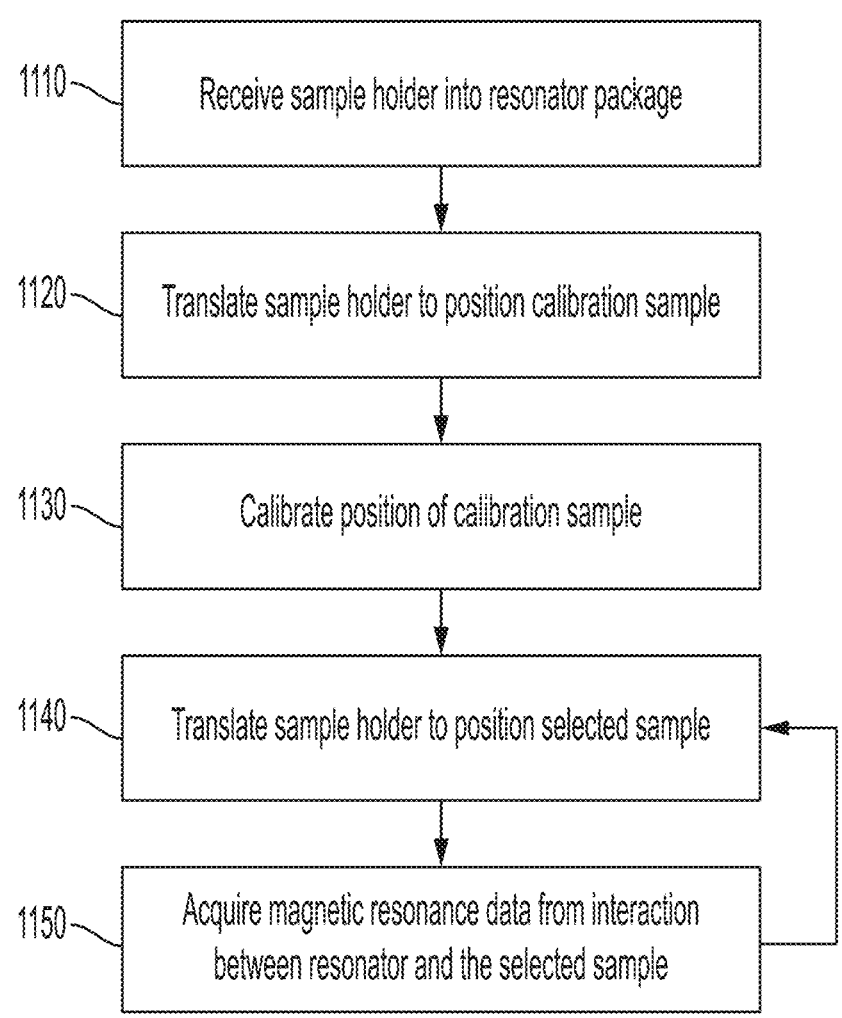
FIG. 11A is a flow diagram illustrating an example process for changing samples in a magnetic resonance system using a calibration sample.

FIG. 11A is a flow diagram illustrating a process 1100 for changing samples in a magnetic resonance system using a calibration sample. In various implementations, the magnetic resonance system may be the example magnetic resonance system 100 discussed above with respect to FIG. 1, or another type of magnetic resonance system. The example process 1100 may include additional or different operations, and the operations may be performed in the order shown or in another order. In some cases, one or more operations may be repeated, omitted, or performed in another manner.

At 1110, a sample holder is received into the resonator package. The sample holder can be, for example, the example sample holder 102 shown in FIG. 1, any of the example sample holders described above and shown in FIGS. 2-9 or FIGS. 13-15, or another type of sample holder. The resonator package operates in a primary magnetic field of a primary magnet system. The resonator package may be disposed in a cryogenic thermal environment controlled by a cooling system. Translation of the sample holder is facilitated by a sample transfer device (e.g., the sample transfer arm 201 shown in FIG. 2, or another type of sample transfer device). In various implementations, the sample transfer device may be used in conjunction with a probe (e.g., as illustrated in FIG. 2); however, in other implementations, the probe may be omitted (e.g., as shown in FIG. 3). A positioning guide may facilitate positioning of the sample holder relative to the resonator.

A sample holder of various shapes or forms could be utilized. The sample holder has a plurality of sample containers formed therein. In some implementations, the sample containers may be, for example, a plurality of channels formed in a face of the sample holder. The sample containers may be separated from each other by a uniform distance or otherwise spaced apart. In some implementations, the sample containers are separated by a known, but non-uniform, distance. In some implementations, a cover slip may be used in conjunction with the sample holder. In some implementations, a plurality of ports are formed in the cover slip so as to provide access to the sample containers.

At 1120, the sample holder is translated such that a sample container that contains a calibration sample is positioned in the sample region of the resonator. In some implementations, translating the sample holder includes moving the sample holder along a single axis. In other implementations, translating the sample holder includes moving the sample holder along multiple axes including, for example, linearly along two axes or rotationally about one or more axes. Translation of the sample holder is facilitated by an actuator, which may be a mechanical actuator, and electro-mechanical actuator, or any of the actuator types described above with respect to FIG. 1.

At 1130, the position of the sample holder relative to the resonator is calibrated. In some implementations, calibrating the position of the sample holder determines a fiducial reference position of the sample holder. The fiducial reference position can be the position where the magnetic resonance signal obtained from the calibration sample meets a calibration criterion or optimization metric. For example, fiducial reference position can be the position where the observed signal to noise ratio is highest (or above a threshold value), the position where the observed signal strength is highest (or above a threshold value), where the observed linewidth is smallest, or a combination of these or other criteria can be used to select the fiducial reference position. The process of calibrating the position of the sample holder typically includes acquiring magnetic resonance signals from the calibration sample at multiple test positions in the sample region of the resonator, and analyzing the magnetic resonance signals to identify one of the test positions as the ideal position of the calibration sample.

At 1140, the sample holder is translated to position a selected sample container, which contains a selected sample for magnetic resonance analysis, in the sample region of the resonator. The fiducial reference position is used as a reference datum when the selected sample container is translated to the sample region. In this manner, the known spacing between the sample containers combined with knowledge of the fiducial reference position can ensure that the first sample is translated to a correct position relative to the resonator, for example, an ideal position for magnetic resonance analysis.

At 1150, magnetic resonance data is acquired from the selected sample. The magnetic resonance data is generated by an interaction between the resonator and the selected sample in the sample region. In various implementations, after magnetic resonance analysis of a first sample in a first sample container, the sample holder may again be translated to position a second sample container, containing a second sample, in the sample region of the resonator. The fiducial reference position can be used again as a reference datum when the second sample is translated to the sample region. Once the second sample is positioned in the sample region, magnetic resonance data may be acquired from the interaction of the second sample with the resonator. This sequence may, in various implementations, be repeated for a third sample, a fourth sample, or more. Thus, multiple samples may be subjected to magnetic resonance analysis without need to remove the sample holder from the cryogenic thermal environment.

Figure 11B:
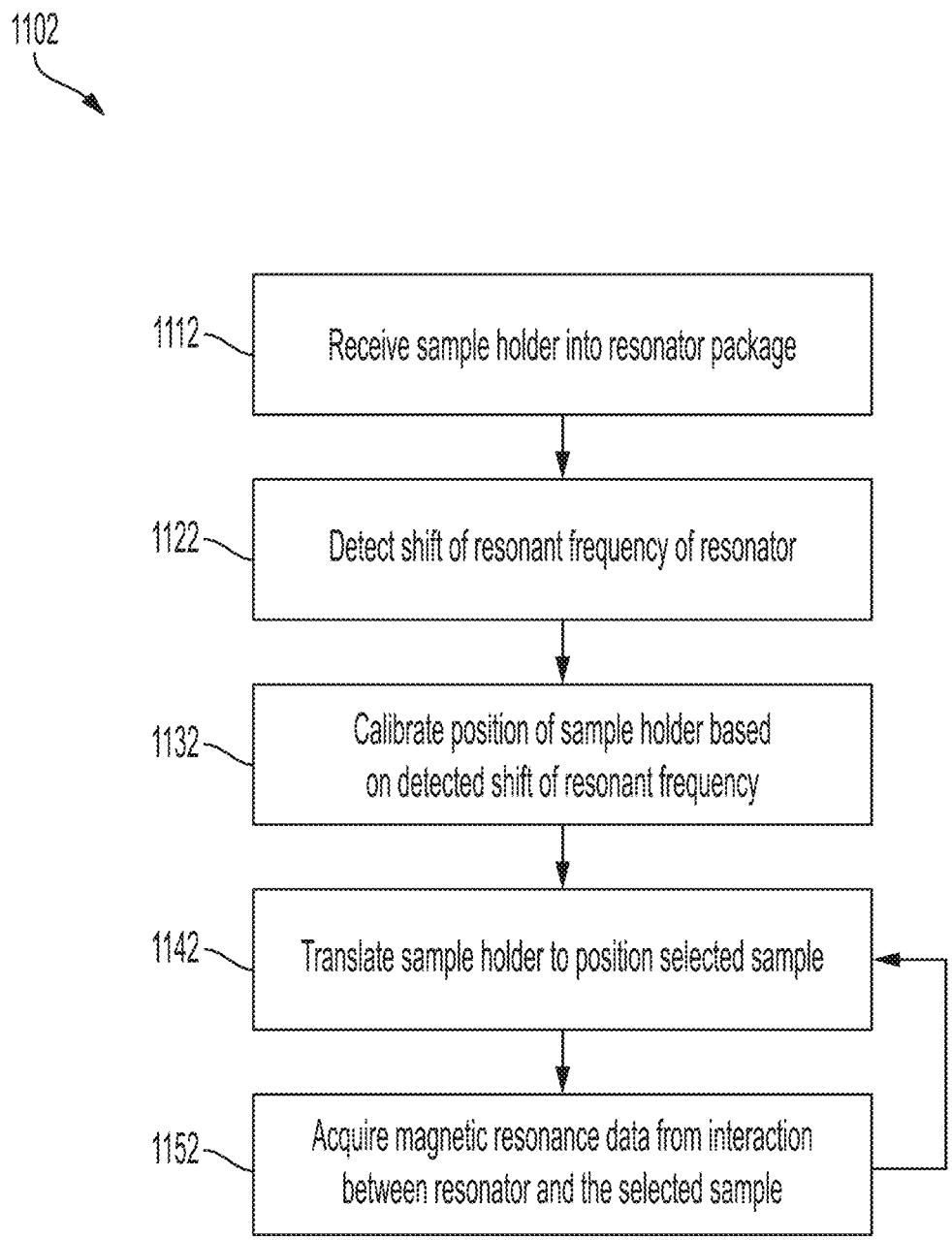
FIG. 11B is a flow diagram illustrating an example process for changing samples in a magnetic resonance system using frequency-shift calibration.

FIG. 11B is a flow diagram illustrating a process 1102 for changing samples in a magnetic resonance system using frequency-shift calibration. In various implementations, the magnetic resonance system may be the example magnetic resonance system 100 discussed above with respect to FIG. 1, or another type of magnetic resonance system. The example process 1102 may include additional or different operations, and the operations may be performed in the order shown or in another order. In some cases, one or more operations may be repeated, omitted, or performed in another manner.

At 1112, a sample holder is received into the resonator package. The sample holder can be, for example, the example sample holder 102 shown in FIG. 1, any of the example sample holders described above and shown in FIGS. 2-9 or FIGS. 13-15, or another type of sample holder. The resonator package operates in a primary magnetic field of a primary magnet system. The resonator package may be disposed in a cryogenic thermal environment controlled by a cooling system. Translation of the sample holder is facilitated by a sample transfer device (e.g., the sample transfer arm 201 shown in FIG. 2, or another type of sample transfer device). In various implementations, the sample transfer device may be used in conjunction with a probe (e.g., as illustrated in FIG. 2); however, in other implementations, the probe may be omitted (e.g., as shown in FIG. 3). A positioning guide may facilitate positioning of the sample holder relative to the resonator.

A sample holder of various shapes or forms could be utilized. The sample holder has a plurality of sample containers formed therein. In some implementations, the sample containers may be, for example, a plurality of channels formed in a face of the sample holder. The sample containers may be separated from each other by a uniform distance or otherwise spaced apart. In some implementations, the sample containers are separated by a known, but non-uniform, distance. In some implementations, a cover slip may be used in conjunction with the sample holder. In some implementations, a plurality of ports are formed in the cover slip so as to provide access to the sample containers.

At 1122, the sample holder is translated such that the leading edge of the sample holder begins to interact with an electric field generated by the resonator. In various implementations, translation of the sample holder may be as described in 1120 of FIG. 11A or by another method.

Figure 11C:
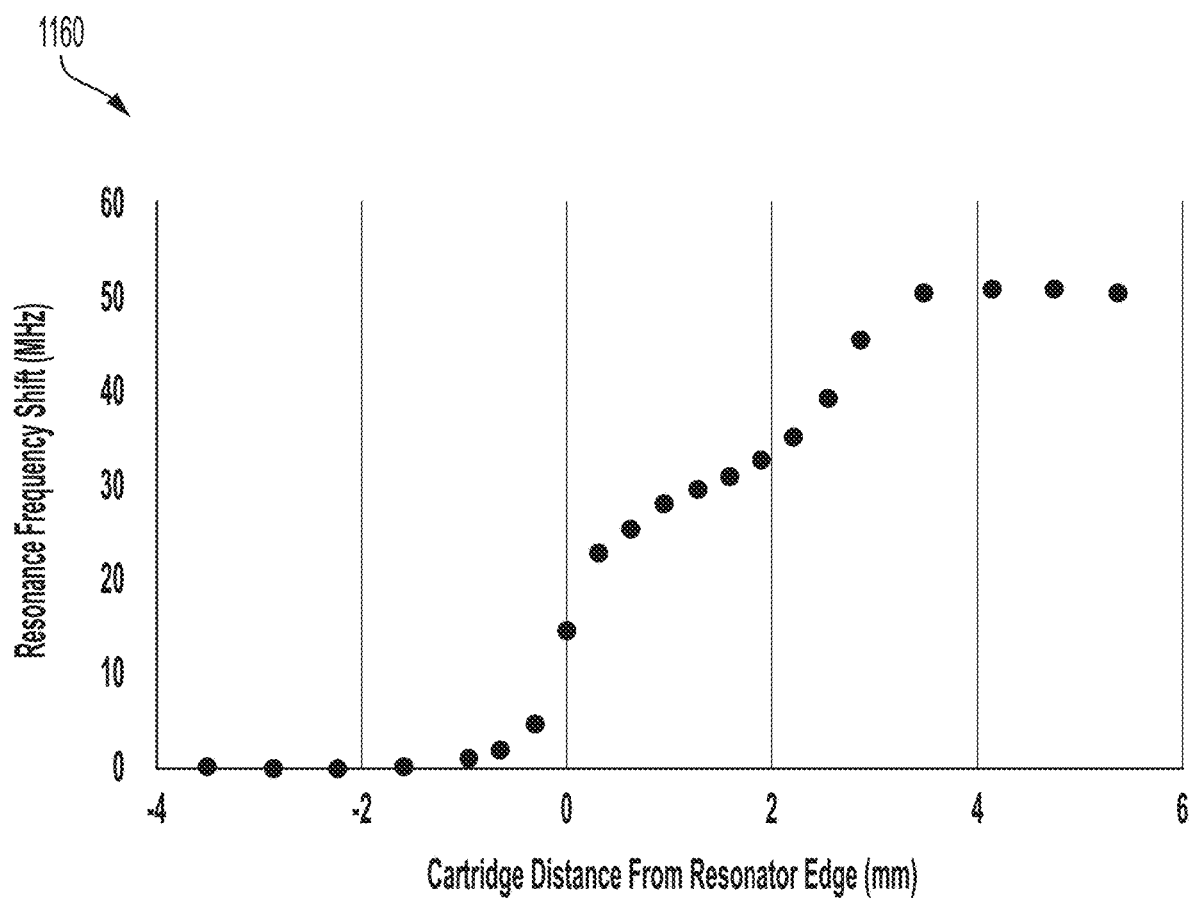
FIG. 11C is an example plot of sample holder position versus frequency shift.
Figure 11D:
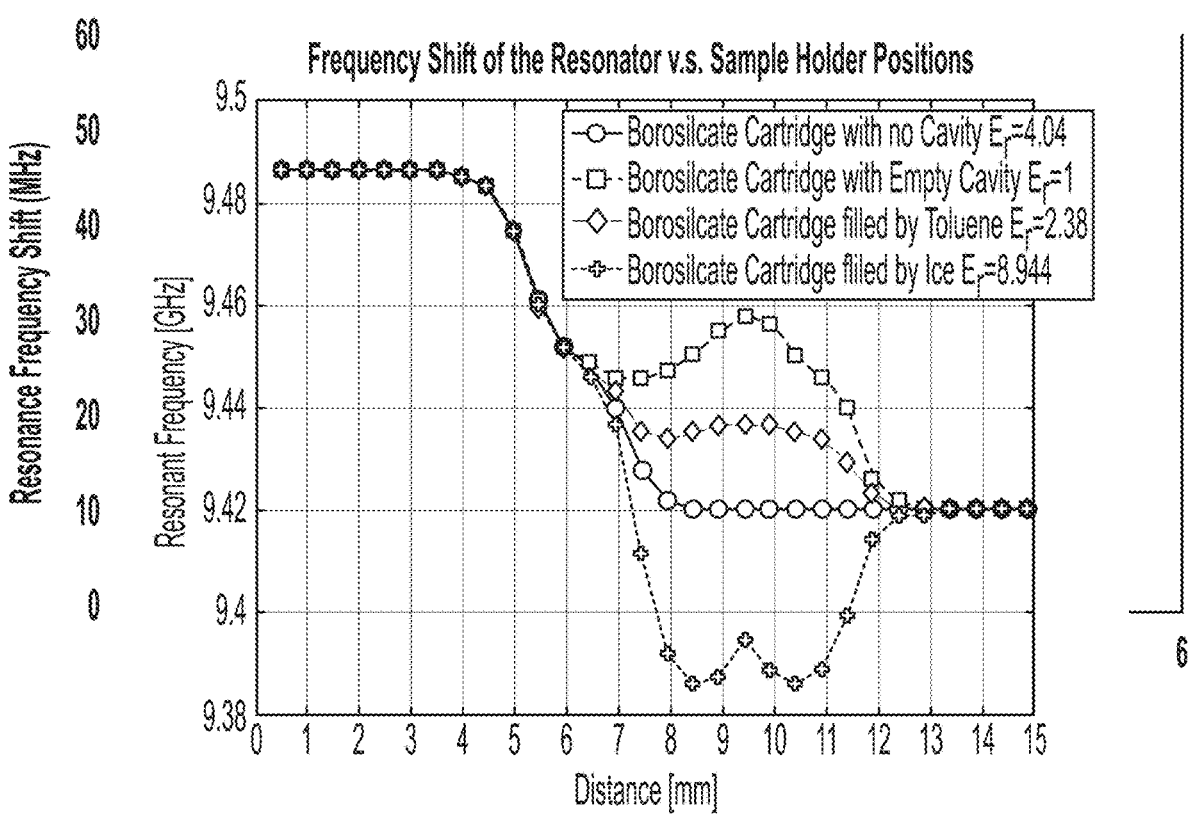
FIG. 11D is an example plot which illustrates the resonant frequency shift induced by sample holders containing samples with differing dielectric constants.

Interaction of the sample holder with the electric field of the resonator causes the resonant frequency of the resonator to shift. The sample holder possesses a dielectric constant higher than that of vacuum, leading to alterations in the effective dielectric constant of the resonator, resulting in effective values denoted as e eff. Consequently, the resonant frequency of the resonator may be expressed according to the equation $$f_r = \frac{C}{2l} \frac{1}{\sqrt{\epsilon_{eff}}}$$

where 'l' signifies the length of the planar λ/2-resonator and 'c' denotes the speed of light. The factor c/2l remains constant. Therefore, if the new $\epsilon_{eff}$ is greater than the effective dielectric constant of the resonator without the sample holder, the resonant frequency decreases. This phenomenon is illustrated in FIG. 11D, which is a plot 1162 that illustrates the resonant frequency shift induced by sample holders of differing dielectric constants. Furthermore, when the dielectric constant of the sample inside the container differs from that of the material composing the sample container, the resonant frequencies experience shifts based on the distance between the sample and the resonator. Such a shift is illustrated by way of example in FIGS. 11C and 11D, which are plots 1160 of sample-holder position versus resonant frequency shift. As shown in FIG. 11C, at a distance of approximately −4 mm to approximately −2 mm, there is approximately zero shift in resonant frequency. At a position of approximately 2 mm relative to the resonator, the resonant frequency shifts by approximately 30 MHz. At a position of approximately 4 mm, the resonant frequency shifts by approximately 50 MHz. The shape of the resonant frequency shift vs sample holder position curve is repeatable. Thus, the position of the sample holder with respect to the resonator can be determined by monitoring the resonance frequency of the resonator, which may be faster to accomplish compared to monitoring a spin signal. For example, as shown in FIG. 11C, a resonant frequency shift of approximate 20-30 MHz corresponds to the edge of the sample holder being aligned with the middle of the resonator. Such a position is then used as a fiducial reference position, facilitating translation of the sample holder to align each of the sample containers with the resonator with high precision. In addition to monitoring the frequency shift profile of the resonator to determine the sample's position, it is possible to measure and track the profiles of other resonator parameters, such as Q-factor and Insertion Loss. These measurements can be taken as the position of the sample holder is adjusted in relation to the resonator.

At 1132, the position of the sample holder relative to the resonator is calibrated. In some implementations, calibrating the position of the sample holder determines the fiducial reference position of the sample holder. The fiducial reference position can be the position where the resonant frequency shift of the resonator indicates alignment of the leading edge of the sample holder with the center of the resonator. As noted above, the process of calibrating the position of the sample holder may include measuring a shift of resonant frequency of the resonator to determine an accurate position of the sample holder.

At 1142, the sample holder is translated to position a selected sample container, which contains a selected sample for magnetic resonance analysis, in the sample region of the resonator. The fiducial reference position is used as a reference datum when the selected sample container is translated to the sample region. In this manner, the known spacing between the sample containers combined with knowledge of the fiducial reference position can ensure that the first sample is translated to a correct position relative to the resonator, for example, an ideal position for magnetic resonance analysis.

At 1152, magnetic resonance data is acquired from the selected sample. The magnetic resonance data is generated by an interaction between the resonator and the selected sample in the sample region. In various implementations, after magnetic resonance analysis of a first sample in a first sample container, the sample holder may again be translated to position a second sample container, containing a second sample, in the sample region of the resonator. The fiducial reference position can be used again as a reference datum when the second sample is translated to the sample region. Once the second sample is positioned in the sample region, magnetic resonance data may be acquired from the interaction of the second sample with the resonator. This sequence may, in various implementations, be repeated for a third sample, a fourth sample, or more. Thus, multiple samples may be subjected to magnetic resonance analysis without need to remove the sample holder from the cryogenic thermal environment.

Figure 13A:
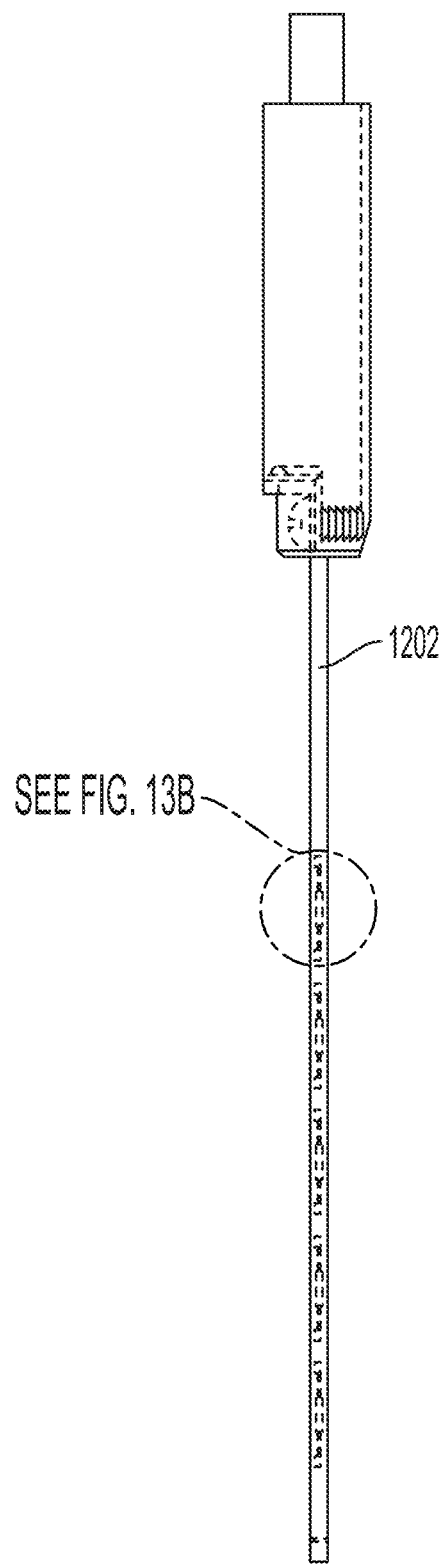
FIG. 13A is a side view of the example sample holder of FIG. 12A.
Figure 13B:
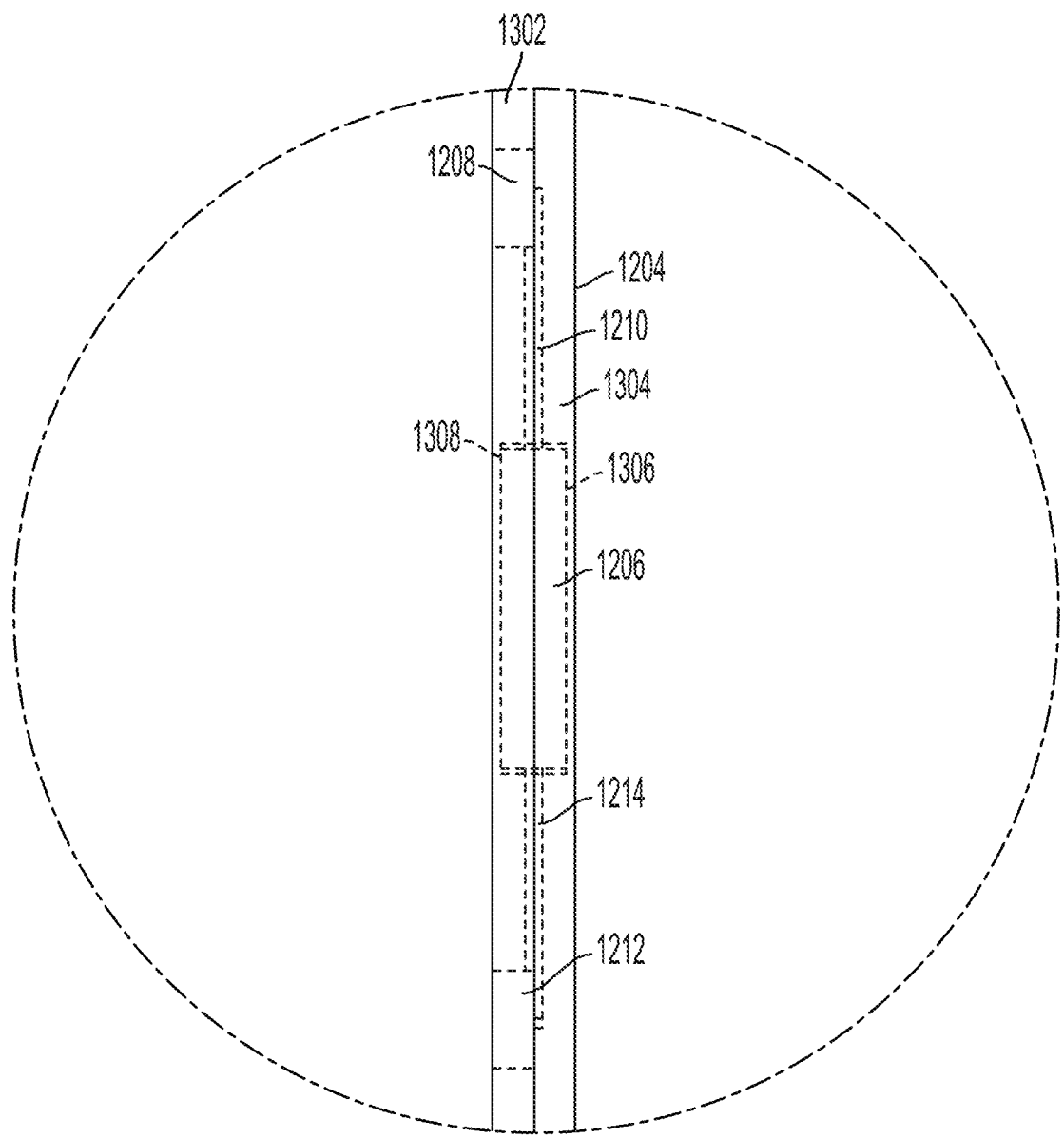
FIG. 13B is a detailed side view of the example sample holder of FIG. 12A.

FIG. 12A is a front view of an example sample holder 1202 illustrating sample containers 1204. FIG. 12B is a detailed front view of a sample container 1204. FIG. 13A is a side view of an example sample holder 1202 illustrating sample containers 1204. FIG. 13B is a detailed side view of a sample container 1204. The sample container 1204 includes a sample cavity 1206 that is fluidly coupled to a first port 1208 via a first channel 1210. The sample cavity 1206 is also fluidly coupled to a second port 1212 via a second channel 1214. The first port 1208 and the second port 1212 are offset from the sample cavity 1206 and disposed on opposite sides of the sample cavity 1206. During operation, the first port 1208 may be used as a fill port through which a magnetic resonance sample is added to the sample cavity 1206. In this arrangement, the second port 1212 acts as an air escape port facilitating filling of the sample cavity 1206. In other implementations, the second port 1212 may be used as a filling port and the first port 1208 may function as an air escape port. Thus, the first port 1208 and the second port 1212 are functionally interchangeable.

In the example shown in FIGS. 12A, 12B, 13A, 13B, the fill ports are sized to receive a pipette tip, so that pipettes (e.g., standard sized pipettes) can be used for filling the sample cavity 1206. In various implementations, the volume of the sample cavity 1206 is in the range of approximately 1 μL to approximately 15 μL, which are amounts that are capable of being handled by pipettes. In other implementations, the sample cavity 1206 may be less than approximately 1 μL. In still other implementations, the sample cavity 1206 may be greater than 15 μL. Standard disposable pipette tips are available with tip outer diameters (Ods) down to ~500 μm. In various implementations, the first port 1208 and the second port 1212 are approximately 600 μm in diameter, so that such standard pipette tips can be inserted into the ports to transfer liquid into the sample cavity. Having a fill port into which the pipette tip can be inserted simplifies the filling process, and may also enable or enhance automated filling processes. In the example shown, the filling ports extend through a first layer 1302 of the sample holder 1202 (typically, ~250 μm) as shown in FIG. 13B.

Generally, although larger fill ports may simplify the filling process, they may also allow higher rates of sample solution evaporation. Significant evaporation may result in bubbles forming in the sample solution and changes to the concentration of the sample solution, neither of which is desirable. In the example shown in FIGS. 12A, 12B, 13A, 13B, the first channel 1210 and the second channel 1214 can be utilized to reduce or avoid sample solution evaporation. As shown, the first channel 1210 and the second channel 1214 exhibit small cross-sections (smaller than the cross-sections of the ports 1208, 1212) and form flow paths that fluidly couple the first port 1208 and the second port 1212, respectively, with the sample cavity 1206. As illustrated in FIGS. 13A-13B, the first channel 1210 and the second channel 1214 can be implemented as trenches in the two substrates that make up the sample holder 1202, and can be small such as, for example, 50 μm×50 μm cross section (e.g., ~100× smaller area compared to the 600 μm diameter fill port). In other implementations, the first channel 1210 and the second channel 1214 may be as small as, for example 10 μm×10 μm cross section (e.g., ~2500× smaller area). The first channel 1210 and the second channel 1214 extend from the first port 1208 and the second port 1212, respectively to opposing diagonal corners of the sample cavity 1206. Such an arrangement can allow gas from the sample cavity 1206 to exhaust during the filling process, and may prevent residual bubbles in the sample cavity 1206 after filling. The small volume of the first channel 1210 and the second channel 1214 may also limit the amount of sample that resides in the outer portions of the resonator's mode volume, where the resonator field is lower, to limit RF inhomogeneity.

The relatively large, deep, and offset nature of the first port 1208 and the second port 1212 enables the use of sealants in some implementations to reduce or prevent evaporation of the magnetic resonance sample from the sample cavity 1206. Materials such as, for example, adhesives, epoxies, waxes, or clays may, in various implementations, be dispensed into the first ports 1208 and the second port 1212 after the sample fill is complete. The offset nature of the first port 1208 and the second port 1212 means that the seal material will have a reduced effect on the magnetic resonance signal from the magnetic resonance sample. In other implementations, the first port 1208 and the second port 1212 may be unsealed.

As illustrated by way of example in FIG. 13B, the sample holder 1202 may be formed from a first layer 1302 that is bonded to a second layer 1304. In various implementations, the bonding of the first layer 1302 to the second layer 1304 may be via, for example, laser welding, chemical adhesives, contact bonding, combinations thereof, or another bonding method. A first plurality of etches 1306 is formed in the first layer 1302 and a second plurality of etches 1308 is formed in the second layer 1304. In various implementations, the first plurality of etches 1306 and the second plurality of etches 1308 extend partially through the thickness of the first layer 1302 and the second layer 1304, respectively. In various implementations, the first plurality of etches 1306 and the second plurality of etches 1308 define portions of the sample cavity 1206, the first port 1208, and the second port 1212 such that the sample cavity 1206, the first port 1208, and the second port 1212 are formed when the first layer 1302 is aligned with, and bonded to, the second layer 1304. In implementations where the first port 1208 and the second port 1212 are offset from the sample cavity 1206, the first plurality of etches 1306 and the second plurality of etches 1308 may also define portions of the first channel 1210 and the second channel 1214 such that the first channel 1210 and the second channel 1212 are also formed when the first layer 1302 is aligned with, and bonded to, the second layer 1304. The principles discussed relative to FIGS. 12A-B and 13A-B may be applied to any implementation of a sample holder described in this disclosure such as, for example, the sample holder 102, 306, 602, 1402, 1450, 1501, or another sample holder.

Figure 14A:
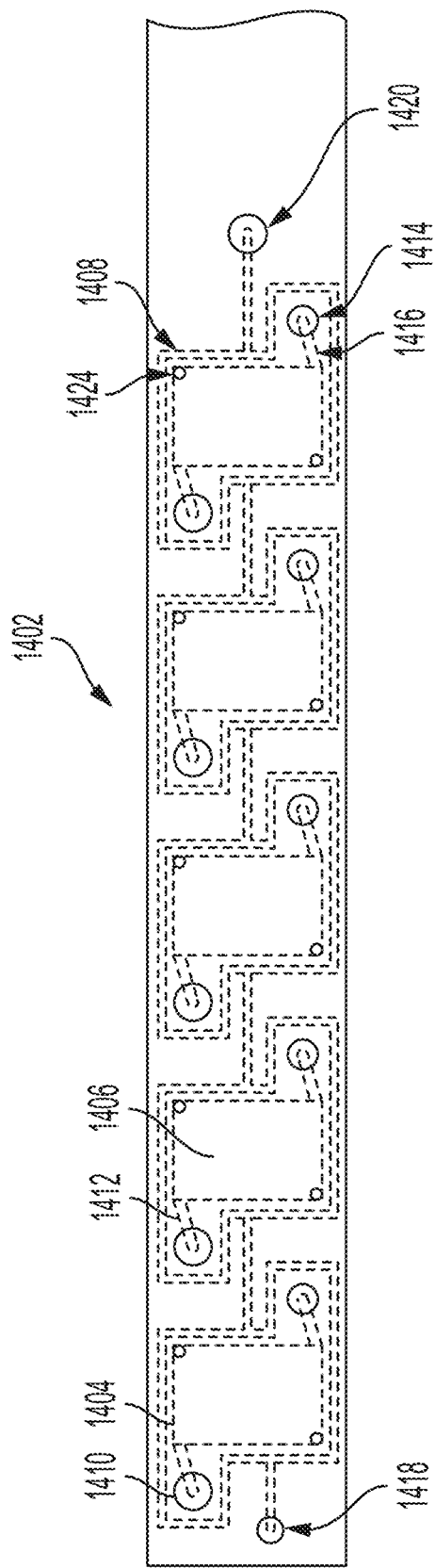
FIG. 14A is a front view of an example sample holder illustrating sample containers with offset entry ports and an adhesive channel.

FIG. 14A is a front view of an example sample holder 1402 illustrating sample containers 1404 with offset ports and an adhesive channel 1408. In various implementations, the sample holder 1402 may be constructed similar to the sample holder 1202 shown in FIGS. 13A-13B. The sample holder 1402 includes sample containers 1404. The sample containers 1404 include a first port 1410 that is offset from a sample cavity 1406 and fluidly coupled to a sample cavity 1406 via a first channel 1412 and a second port 1414 that is offset from the sample cavity 1406 and fluidly coupled to the sample cavity 1406 via a second channel 1416.

In various implementations, a first adhesive port 1418 and a second adhesive port 1420 are formed in the sample holder 1402. The first adhesive port 1418 and the second adhesive port 1420 are fluidly coupled to an adhesive channel 1408 that is defined in the sample holder 1402. The adhesive channel 1408 defines a fluid path that surrounds each of the sample containers 1404. During operation, a chemical adhesive is injected into the first adhesive port 1418. The chemical adhesive then fills the adhesive channel 1408 as air is expelled through the second adhesive port 1420. The chemical adhesive facilitates secure bonding of layers of the sample holder 1402 such as, for example, the first layer 1302 and the second layer 1304 illustrated in FIG. 13B. In various implementations, the chemical adhesive that is injected into the adhesive channel 1408 may be used alone or, in other implementations, the chemical adhesive may be used in combination with other bonding methodologies including, for example, laser welding or contact bonding.

Vent ports 1424 are fluidly coupled to the sample cavity 1406. In various implementations, the vent ports 1424 may be formed in opposite corners of the sample cavity 1406 from the first port 1410 and the second port 1412; however, in other implementations, the vent ports 1424 may be located elsewhere and fluidly coupled to the sample cavity 1406. How the sample cavity 1406 fills depends on the wetting characteristics of the sample solution on the material of the sample holder 1402. In some cases, the solution fills the perimeter of the sample cavity 1406 first, and in some cases can block the first port 1410 and the second port 1414 before the sample cavity 1406 is completely filled, leaving a trapped air bubble in the sample cavity 1406. Addition of the vent ports 1424 to the sample cavity 1406 facilitates escape of air from the sample cavity 1406 and facilitates complete filling of the sample cavity 1406.

Figure 14B:
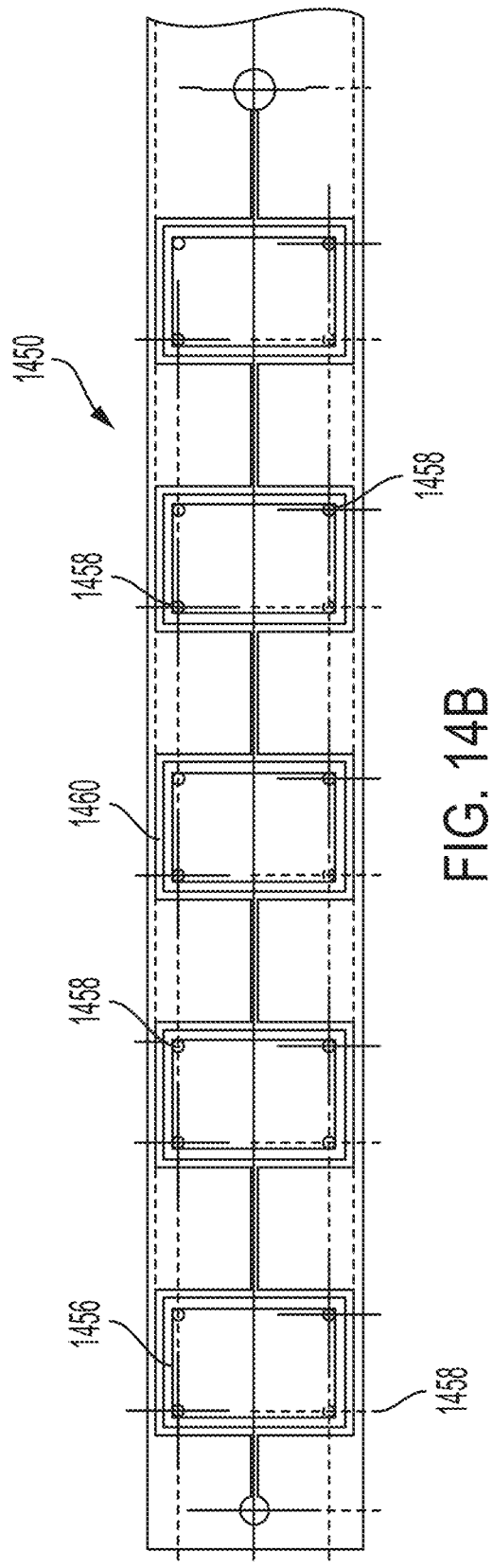
FIG. 14B is a front view of an example sample holder illustrating sample containers with multiple entry ports and an adhesive channel.

FIG. 14B is a front view of an example sample holder 1450 illustrating sample containers 1456 with multiple ports 1458 and an adhesive channel 1460. In various implementations, the sample holder 1450 is similar in construction and operation to the sample holder 1402. The sample holder 1450, however, omits the first port 1410, the second port 1414, the first channel 1412, and the second channel 1416. By way of example, the sample holder 1450 includes four ports 1458 that are fluidly coupled to the sample cavities 1406. During operation, one of the ports 1458 may be utilized for sample loading, while the remaining ports 1458 may be utilized for air escape. The principles discussed relative to FIGS. 14A-B may be applied to any implementation of a sample holder described in this disclosure such as, for example, the sample holder 102, 306, 602, 1202, 1501, or another sample holder.

Figure 14C:
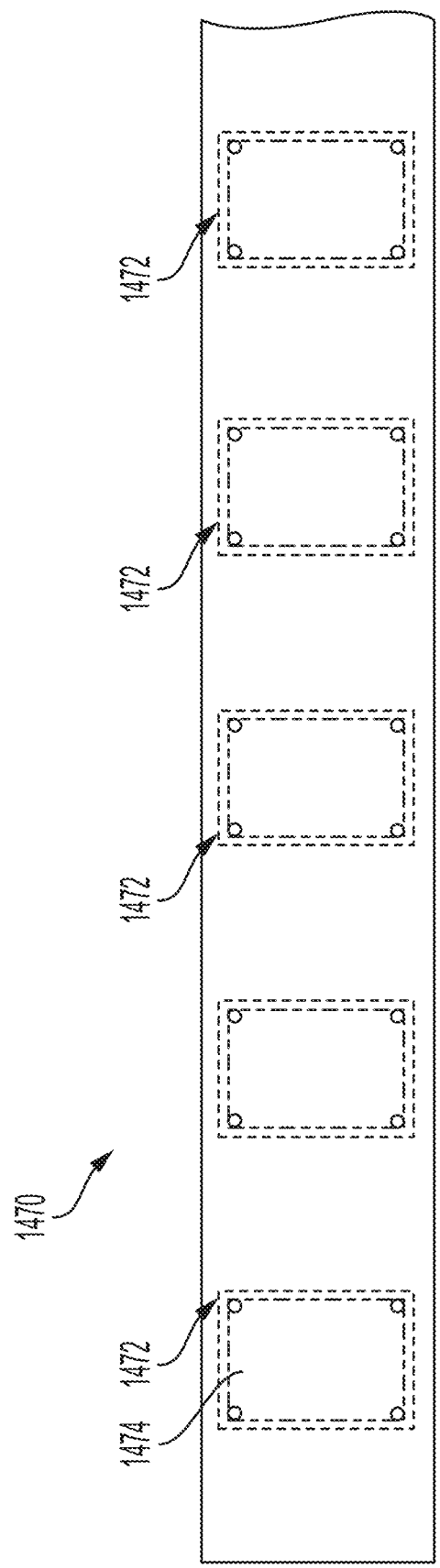
FIG. 14C is a front view of an example sample holder illustrating laser weld paths.
Figure 14D:
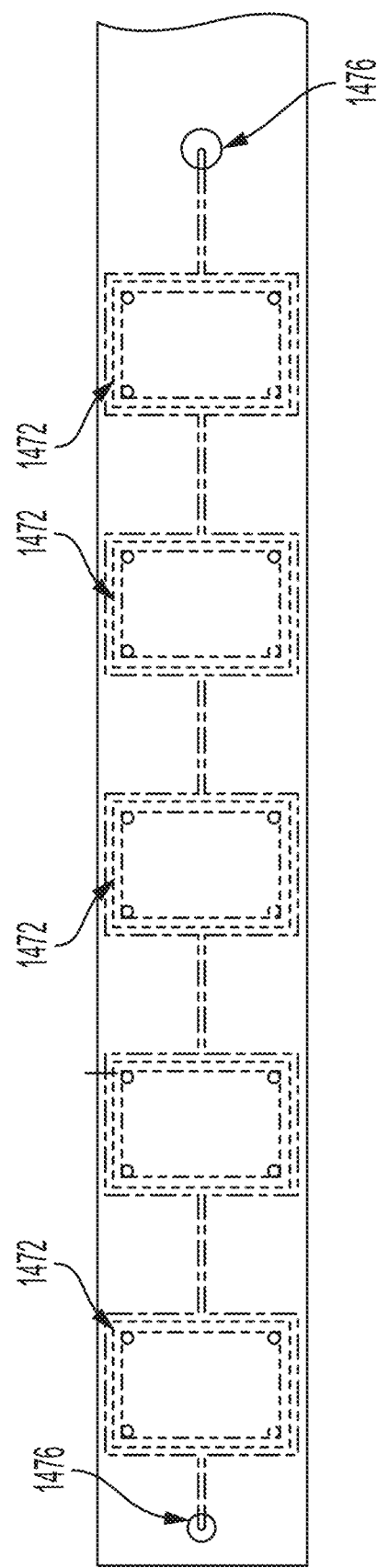
FIG. 14D is a front view of the example sample holder including an adhesive channel and laser welds.

FIG. 14C is a front view of an example sample holder 1470 illustrating laser weld paths 1472. FIG. 14D is a front view of the example sample holder 1470 including an adhesive channel 1476. The principles discussed relative to FIGS. 14C-D may be applied to any implementation of a sample holder described in this disclosure such as, for example, the sample holder 102, 306, 602, 1202, 1501, or another sample holder. Laser welding is a joining process where a focused laser beam is used to generate heat and pressure. Laser welding is a precise process that results in minimal heat distortion and thermal stress on the sample holder 1470. The laser weld paths 1472 are disposed around a perimeter of the sample containers 1474. The laser weld paths 1472 indicate a path traversed by a laser welder and a location of laser welding on the sample holder 1470. As illustrated in FIG. 14D, laser welding may be used in conjunction with an adhesive channel 1476. The adhesive channel may be, in various implementations, similar to the adhesive channel 1408 described above. Use of the adhesive channel 1476 in combination with the laser weld path 1472 facilitates secure bonding of the layers of the sample holder 1470.

Figure 15:
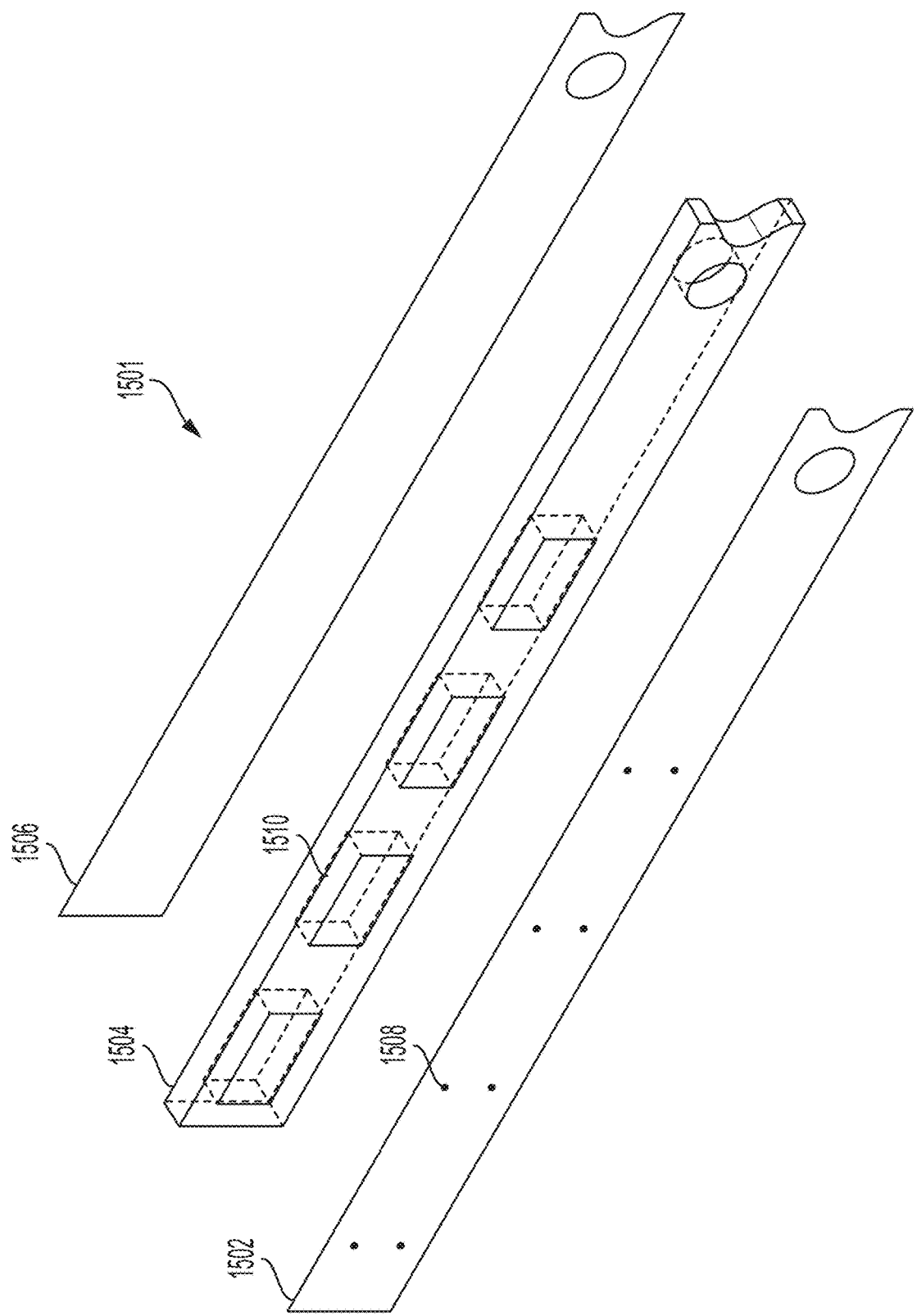
FIG. 15 is an exploded view of an example three-layer sample holder.

FIG. 15 is an exploded view of an example three-layer sample holder 1501. The sample holder 1202 may be formed from a first layer 1502 that is bonded to a second layer 1504, and a third layer 1506. In various implementations, the bonding of the first layer 1502 to the second layer 1504 and the third layer 1506 may be via, for example, laser welding, chemical adhesives, contact bonding, combinations thereof, or other bonding method. A first plurality of etches 1508 are formed in the first layer 1502 and a second plurality of etches 1510 are formed in the second layer 1504. The third layer 1506 is unetched. In various implementations, the first plurality of etches 1508 and the second plurality of etches 1510 extend entirely through the thickness of the first layer 1502 and the second layer 1504, respectively. In various implementations, the first plurality of etches 1508 and the second plurality of etches 1510 define portions of a sample cavity, a first port, and a second port such that the sample cavity, the first port, and the second port are formed when the first layer 1502 is aligned with, and bonded to, the second layer 1504 and the third layer 1506. In implementations where the first port and the second port are offset from the sample cavity, the first plurality of etches 1508 and the second plurality of etches 1510 may also define portions of a first channel and a second channel such that the first channel and the second channel are also formed when the first layer 1502 is aligned with, and bonded to, the second layer 1504 and the third layer 1506.

The three-layer sample holder 1502 does not require etching to a specific depth—the first plurality of etches 1508 and the second plurality of etches 1510 extend entirely through the first layer 1502 and the second layer 1504, respectively. This means that either a more traditional etch process could be used, or another type of machining, such as laser cutting or waterjet. In such an arrangement, the surface of the first layer 1502, the second layer 1504, and the third layer 1506 would not be affected by the etch process, so it would remain in its native condition, which would facilitate some bonding alternatives, such as contact bonding. Contact bonding is a glueless process whereby two surfaces that have a high degree of conformity are held together by intermolecular forces. Contact bonding requires that the surfaces, for example, the first layer 1502, the second layer 1504, and the third layer 1506, be very smooth and flat. The full-thickness etching of the first plurality of etches 1508 and the second plurality of etches 1510 maintains the outer surfaces of first layer 1502 and the second layer 1504 in their native condition thereby facilitating contact bonding between the first layer 1502, the second layer 1504, and the third layer 1506. The principles discussed relative to FIG. 15 may be applied to any implementation of a sample holder described in this disclosure such as, for example, the sample holder 102, 306, 602, 1202, 1402, 1450, or another sample holder.

In a general aspect, the systems and techniques described herein allow for changing samples in a magnetic resonance system.

In a first example, a magnetic resonance apparatus, includes a resonator. A sample holder includes a plurality of sample containers. A sample transfer device is operable to translate the sample holder relative to the resonator to position any one of the sample containers in a sample region of the resonator.

Implementations of the first example may include one or more of the following features. For example, in some implementations, the sample transfer device translates the sample holder relative to the resonator to maximize a filling factor of any one of the sample containers relative to the other sample containers. In some implementations, the resonator is configured to generate a control field in the sample region. The sample transfer device is operable to selectively position any one of the sample containers in the sample region.

In some implementations of the first example, at least one sample container of the plurality of sample containers contains a calibration sample.

In some implementations of the first example, the plurality of sample containers comprises a plurality of channels defined in the sample holder.

Implementations of the first example may include one or more of the following features. Each sample container may include a sample cavity and a fill port that is offset from and fluidly coupled to the sample cavity by a sample channel. Each sample container may include an air escape port that is offset from the sample cavity on a side opposite the fill port and is fluidly coupled to the sample cavity by an air escape channel. The fill port may be sized to receive a pipette tip. A sealant may be applied to the fill port and the air escape port. Each of the plurality of channels comprises a surface that is contoured to match a spatial distribution of a resonator control field produced by the resonator. The sample holder may include a cover slip that encloses the plurality of channels. The cover slip defines ports that provide fluid communication to the plurality of channels. The ports may be sealed.

In some implementations of the first example, the sample transfer arm is operable to transfer the sample holder linearly in a first direction, and the sample containers are spaced apart from each other in the first direction.

In some implementations of the first example, the sample holder may include an elongated prismatic body defining a plurality of planar exterior surfaces. The sample containers comprise channels defined in one of the plurality of planar exterior surfaces.

In some implementations of the first example, the sample holder may include an elongated cylindrical body defining a lateral surface. The sample containers may include channels defined in the lateral surface.

In some implementations of the first example, the plurality of sample containers may include a plurality of capillary tubes in the sample holder.

Some implementations of the first example include a resonator package that includes the resonator. The sample holder is at least partially disposed within the resonator package. The resonator package may include a positioning guide that facilitates alignment of the sample holder with the resonator.

In some implementations of the first example, the sample transfer arm comprises a first end that is exposed to room temperature and a second end that is exposed to cryogenic temperature during operation.

In some implementations of the first example, the second end of the sample transfer arm contacts the sample holder. The first end of the sample transfer arm is mechanically coupled to an actuator that moves the sample transfer arm.

In some implementations of the first example, the resonator may be a planar resonator. Additional implementations may include a resonator chip. The resonator may be a microstrip resonator defined on a surface of the resonator chip.

In some implementations of the first example, the resonator may be a three-dimensional cavity.

In some implementations of the first example, the resonator may be configured to operate in a primary magnetic field of a probeless magnetic resonance system.

In some implementations of the first example, the resonator may be configured to operate on a probe in a primary magnetic field of a magnetic resonance system.

In some implementations of the first example, translation of the sample holder relative to the resonator comprises translation of the sample holder along multiple axes.

In a second example, a magnetic resonance system includes a primary magnet system that is configured to generate a primary magnetic field. A resonator is configured to interact with a sample in a sample region. A sample holder includes a plurality of sample containers. A sample transfer device that translates the sample holder relative to the resonator to position any one of the sample containers in the sample region.

Implementations of the second example may include one or more of the following features. The sample transfer device may include a sample transfer rod. Some implementations may include a probe, which includes the resonator. Some implementations may include a cryogenic system that controls a cryogenic thermal environment of the resonator. The sample transfer rod may extend from outside the cryogenic thermal environment to inside the cryogenic thermal environment. The plurality of sample containers may reside in the cryogenic thermal environment. The sample transfer device may be operable to translate the sample holder relative to the resonator to maximize a filling factor of any one of the sample containers relative to the other sample containers. At least one sample container of the plurality of sample containers may contain a calibration sample.

In some implementations of the second example, the plurality of sample containers may include a plurality of channels defined in the sample holder. Each sample container may include a sample cavity and a fill port that is offset from and fluidly coupled to the sample cavity by a sample channel.

In some implementations of the second example, each sample container may include an air escape port that is offset from the sample cavity on a side opposite the fill port and is fluidly coupled to the sample cavity by an air escape channel. The fill port may be sized to receive a pipette tip. A sealant may be applied to the fill port and the air escape port.

In some implementations of the second example each of the plurality of sample containers may include a surface that is contoured to match a spatial distribution of a resonator control field produced by the resonator.

In some implementations of the second example, the sample transfer device may be operable to transfer the sample holder linearly in a first direction. The sample containers may be spaced apart from each other in the first direction.

In some implementations of the second example, the sample transfer device may include a first end that is exposed to room temperature and a second end that is exposed to cryogenic temperature during operation. The sample transfer device may be configured to translate the sample holder along multiple axes.

In a third example, a magnetic resonance sample changer system includes a sample holder including a plurality of sample containers. At least one of the sample containers includes a calibration sample. The sample holder is configured to move relative to a resonator in a primary magnetic field of a magnetic resonance system. The sample holder is configured to mechanically couple with an actuator that positions the sample holder relative to a reference position determined by magnetic resonance measurement of the calibration sample.

Implementations of the third example may include the actuator. Additional implementations may include a sample transfer arm that mechanically couples the sample holder to the actuator. The actuator may include at least one of a servo, caliper, or micrometer.

Implementations of the third example may include a position control system that controls the actuator.

Implementations of the third example may include one or more of the following features. The plurality of sample containers may include a plurality of channels defined in the sample holder. Each sample container may include a sample cavity and a fill port that is offset from and fluidly coupled to the sample cavity by a sample channel. Each sample container may include an air escape port that is offset from the sample cavity on a side opposite the fill port and is fluidly coupled to the sample cavity by an air escape channel. The fill port may be sized to receive a pipette tip. A sealant may be applied to the fill port and the air escape port.

In some implementations of the third example, each of the plurality of sample containers may include a surface that is contoured to match a spatial distribution of a resonator control field produced by the resonator.

In some implementations of the third example, the sample holder may include a cover slip that encloses the plurality of channels.

In some implementations of the third example, the cover slip defines ports that provide fluid communication to the plurality of channels.

In some implementations of the third example, the port may include plugs.

In some implementations of the third example, the sample containers are spaced apart from each other in a first direction.

In some implementations of the third example, the sample holder may include an elongated prismatic body defining a plurality of planar exterior surfaces. The sample containers may include channels defined in one of the plurality of planar exterior surfaces.

In some implementations of the third example, the sample holder may include an elongated cylindrical body defining a lateral surface. The sample containers may include channels defined in the lateral surface.

In some implementations of the third example, the plurality of sample containers may include a plurality of capillary tubes in the sample holder.

In a fourth example, a magnetic resonance method includes receiving a sample holder into a resonator package. The resonator package is disposed in a primary magnetic field of a magnetic resonance system. The resonator package may include a resonator configured to interact with a sample in a sample region. The sample holder may include a first sample and a calibration sample. The sample holder is translated to position the calibration sample in the sample region. The position of the sample holder is calibrated relative to the resonator based on first magnetic resonance signals generated by an interaction between the resonator and the calibration sample. After calibrating the position of the sample holder, the sample holder is translated to position the first sample in the sample region. Magnetic resonance data is acquired based on second magnetic resonance signals generated by an interaction between the resonator and the first sample.

In some implementations of the fourth example, the sample holder may include a plurality of additional samples. The method may include iteratively translating the sample holder to position one of the plurality of additional samples in the sample region, and acquiring magnetic resonance data based on magnetic resonance signals generated by an interaction between the resonator and the sample currently positioned in the sample region.

Some implementations of the fourth example may include cooling the sample holder to a cryogenic temperature before calibrating the position of the sample holder.

In some implementations of the fourth example, translating the sample holder may include linearly translating the sample holder.

In some implementations of the fourth example, translating the sample holder may include translating the sample holder along multiple axes.

In some implementations of the fourth example, the magnetic resonance system is the magnetic resonance system of any one of second example.

In a fifth example, a magnetic resonance system includes a primary magnet system that is configured to generate a primary magnetic field. A resonator is configured to interact with a sample in a sample region. A sample holder includes a plurality of sample containers. A sample transfer device translates the sample holder relative to the resonator to position any one of the sample containers in the sample region.

Implementations of the fifth example may include one or more of the following features. For example, the sample transfer device may include a sample transfer rod. Further, implementations of the fifth example may include a cryogenic system that controls a cryogenic thermal environment of the resonator. The sample transfer rod extends from outside the cryogenic thermal environment to inside the cryogenic thermal environment. In such implementations, the plurality of sample containers may reside in the cryogenic thermal environment.

In some implementations of the fifth example, the sample transfer device is operable to translate the sample holder relative to the resonator to maximize a filling factor of any one of the sample containers relative to the other sample containers.

In some implementations of the fifth example, at least one sample container of the plurality of sample containers contains a calibration sample.

In some implementations of the fifth example, introduction of the sample holder to an electric field of the resonator induces a shift in a resonant frequency of the resonator. The shift in the resonant frequency indicates a position of the sample holder relative to the resonator.

Implementations of the fifth example may include one or more of the following features. For example, each sample container may include a sample cavity and a fill port that is fluidly coupled to the sample cavity as well as an air escape port that is fluidly coupled to the sample cavity. Further, in implementations of the fifth example the sample holder may include a first layer having a first plurality of etches formed in a planar surface thereof and a second layer having a second plurality of etches formed in a planar surface thereof. When the first layer is aligned with the second layer, the first plurality of etches and the second plurality of etches align to form the sample cavity, the fill port, and the air escape port.

Implementations of the fifth example may include one or more of the following features. For example, implementations of the sample holder may include a first layer having a first plurality of etches formed through a full thickness of the first layer, a second layer having a second plurality of etches formed through a full thickness of the second layer, and a third un-etched layer. When the first layer, the second layer, and the third layer are aligned, the first plurality of etches and the second plurality of etches align to form the sample cavity, the fill port, and the air escape port. Further, in implementations of the fifth example, the fill port may be offset from the sample cavity and fluidly coupled to the sample cavity by a sample channel. The air escape port may be offset from the sample cavity on a side opposite the fill port and is fluidly coupled to the sample cavity by an air escape channel.

In implementations of the fifth example, the sample holder may include an adhesive port formed in one of the first layer or the second layer, an adhesive vent formed in one of the first layer or the second layer, and an adhesive channel that fluidly couples the adhesive port to the adhesive vent and defines a fluid path surrounding each of the sample cavities.

In implementations of the fifth example, the sample holder may include an elongated prismatic body defining a plurality of planar exterior surfaces, and the sample containers comprise channels defined in one of the plurality of planar exterior surfaces. In other implementations of the fifth example, the sample holder may include an elongated cylindrical body defining a lateral surface, and the sample containers comprise channels defined in the lateral surface. In other implementations of the fifth example, the plurality of sample containers may include a plurality of capillary tubes in the sample holder.

Implementations of the fifth example may include a resonator package that includes the resonator. The sample holder is at least partially disposed within the resonator package. The resonator package may include a positioning guide that facilitates alignment of the sample holder with the resonator.

Implementations of the fifth example may include a resonator chip. In various implementations, the resonator is a planar microstrip resonator defined on a surface of the resonator chip.

In a sixth example, a magnetic resonance method includes receiving a sample holder into a resonator package. The resonator package is disposed in a primary magnetic field of a magnetic resonance system. The resonator package includes a resonator configured to interact with a sample in a sample region. A position of the sample holder relative to the resonator is calibrated. Based on the calibration, the sample holder is translated to position the sample in the sample region. Magnetic resonance data is acquired based on magnetic resonance signals generated by an interaction between the resonator and the first sample.

Implementations of the sixth example may include translating the sample holder to position a calibration sample contained in the sample holder in the sample region, and calibrating the position of the sample holder relative to the resonator based on magnetic resonance signals generated by an interaction between the resonator and the calibration sample.

In implementations of the sixth example, the sample holder may include a plurality of additional samples, and the method may include iteratively translating the sample holder to position one of the plurality of additional samples in the sample region, and acquiring magnetic resonance data based on magnetic resonance signals generated by an interaction between the resonator and the sample currently positioned in the sample region.

In implementations of the sixth example, calibrating the position of the sample holder may include detecting a shift in a resonant frequency of the resonator, the shift in the resonant frequency resulting from the sample holder entering an electric field of the resonator, and based on the detected shift in the resonant frequency, determining a position of the sample holder relative to the resonator.

Implementations of the sixth example may include cooling the sample holder to a cryogenic temperature before calibrating the position of the sample holder.

In a seventh example, a magnetic resonance apparatus, includes a resonator. A sample holder includes a plurality of sample containers. A sample transfer device is operable to translate the sample holder relative to the resonator to position any one of the sample containers in a sample region of the resonator.

Implementations of the seventh example may include one or more of the following features. For example, the sample transfer device may include a sample transfer rod. Further, implementations of the first example may include a cryogenic system that controls a cryogenic thermal environment of the resonator. The sample transfer rod extends from outside the cryogenic thermal environment to inside the cryogenic thermal environment. In such implementations, the plurality of sample containers may reside in the cryogenic thermal environment.

In some implementations of the seventh example, the sample transfer device is operable to translate the sample holder relative to the resonator to maximize a filling factor of any one of the sample containers relative to the other sample containers.

In some implementations of the seventh example, at least one sample container of the plurality of sample containers contains a calibration sample.

In some implementations of the seventh example, introduction of the sample holder to an electric field of the resonator induces a shift in a resonant frequency of the resonator. The shift in the resonant frequency indicates a position of the sample holder relative to the resonator.

Implementations of the seventh example may include one or more of the following features. For example, each sample container may include a sample cavity and a fill port that is fluidly coupled to the sample cavity as well as an air escape port that is fluidly coupled to the sample cavity. Further, in implementations of the seventh example the sample holder may include a first layer having a first plurality of etches formed in a planar surface thereof and a second layer having a second plurality of etches formed in a planar surface thereof. When the first layer is aligned with the second layer, the first plurality of etches and the second plurality of etches align to form the sample cavity, the fill port, and the air escape port.

Implementations of the seventh example may include one or more of the following features. For example, implementations of the sample holder may include a first layer having a first plurality of etches formed through a full thickness of the first layer, a second layer having a second plurality of etches formed through a full thickness of the second layer, and a third un-etched layer. When the first layer, the second layer, and the third layer are aligned, the first plurality of etches and the second plurality of etches align to form the sample cavity, the fill port, and the air escape port. Further, in implementations of the seventh example, the fill port may be offset from the sample cavity and fluidly coupled to the sample cavity by a sample channel. The air escape port may be offset from the sample cavity on a side opposite the fill port and is fluidly coupled to the sample cavity by an air escape channel.

In implementations of the seventh example, the sample holder may include an adhesive port formed in one of the first layer or the second layer, an adhesive vent formed in one of the first layer or the second layer, and an adhesive channel that fluidly couples the adhesive port to the adhesive vent and defines a fluid path surrounding each of the sample cavities.

In implementations of the seventh example, the sample holder may include an elongated prismatic body defining a plurality of planar exterior surfaces, and the sample containers comprise channels defined in one of the plurality of planar exterior surfaces. In other implementations of the seventh example, the sample holder may include an elongated cylindrical body defining a lateral surface, and the sample containers comprise channels defined in the lateral surface. In other implementations of the seventh example, the plurality of sample containers may include a plurality of capillary tubes in the sample holder.

Implementations of the seventh example may include a resonator package that includes the resonator. The sample holder is at least partially disposed within the resonator package. The resonator package may include a positioning guide that facilitates alignment of the sample holder with the resonator.

Implementations of the seventh example may include a resonator chip. In various implementations, the resonator is a planar microstrip resonator defined on a surface of the resonator chip.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. For example, in various implementations, a guide system may be utilized to facilitate insertion and placement of the sample holder within the resonator package and to prevent breakage of the sample holder. Such a guide system may include, for example rails that support opposite edges of the sample holder during placement. Accordingly, other embodiments are within the scope of the following claims.

The following represent embodiments according to aspects of the disclosure:

1. A magnetic resonance apparatus, comprising:
    a resonator;
    a sample holder comprising a plurality of sample containers; and
    a sample transfer arm operable to translate the sample holder relative to the resonator to position any one of the sample containers in a sample region of the resonator.
2. The magnetic resonance apparatus of embodiment 1, wherein the sample transfer arm is operable to translate the sample holder relative to the resonator to maximize a filling factor of any one of the sample containers relative to the other sample containers.
3. The magnetic resonance apparatus of embodiment 1, wherein the resonator is configured to generate a control field in the sample region, and the sample transfer arm is operable to selectively position any one of the sample containers in the sample region.
4. The magnetic resonance apparatus of embodiment 1, wherein at least one sample container of the plurality of sample containers contains a calibration sample.
5. The magnetic resonance apparatus of embodiment 1, wherein the plurality of sample containers comprises a plurality of channels defined in the sample holder.
6. The magnetic resonance apparatus of embodiment 1, wherein each sample container comprises a sample cavity and a fill port that is offset from and fluidly coupled to the sample cavity by a sample channel.
7. The magnetic resonance apparatus of embodiment 6, wherein each sample container comprises an air escape port that is offset from the sample cavity on a side opposite the fill port and is fluidly coupled to the sample cavity by an air escape channel.
8. The magnetic resonance apparatus of embodiment 7, wherein the fill port is sized to receive a pipette tip.
9. The magnetic resonance apparatus of embodiment 7, wherein a sealant is applied to the fill port and the air escape port.
10. The magnetic resonance apparatus of embodiment 5, wherein each of the plurality of channels comprises a surface that is contoured to match a spatial distribution of a resonator control field produced by the resonator.
11. The magnetic resonance apparatus of embodiment 5, wherein the sample holder comprises a cover slip that encloses the plurality of channels.
12. The magnetic resonance apparatus of embodiment 11, wherein the cover slip defines ports that provide fluid communication to the plurality of channels.
13. The magnetic resonance apparatus of embodiment 13, wherein the port are sealed.
14. The magnetic resonance apparatus of embodiment 1, wherein the sample transfer arm is operable to transfer the sample holder linearly in a first direction, and the sample containers are spaced apart from each other in the first direction.
15. The magnetic resonance apparatus of embodiment 1, wherein the sample holder comprises an elongated prismatic body defining a plurality of planar exterior surfaces, and the sample containers comprise channels defined in one of the plurality of planar exterior surfaces.
16. The magnetic resonance apparatus of embodiment 1, wherein the sample holder comprises an elongated cylindrical body defining a lateral surface, and the sample containers comprise channels defined in the lateral surface.
17. The magnetic resonance apparatus of embodiment 1, wherein the plurality of sample containers comprises a plurality of capillary tubes in the sample holder.
18. The magnetic resonance apparatus of embodiment 1, comprising a resonator package that includes the resonator, wherein the sample holder is at least partially disposed within the resonator package, the resonator package comprises a positioning guide that facilitates alignment of the sample holder with the resonator.
19. The magnetic resonance apparatus of embodiment 1, wherein the sample transfer arm comprises a first end that is exposed to room temperature and a second end that is exposed to cryogenic temperature during operation.
20. The magnetic resonance apparatus of embodiment 19, wherein the second end of the sample transfer arm contacts the sample holder, and the first end of the sample transfer arm is mechanically coupled to an actuator that moves the sample transfer arm.
21. The magnetic resonance apparatus of embodiment 1, wherein the resonator is a planar resonator.
22. The magnetic resonance apparatus of embodiment 21, comprising a resonator chip, wherein the resonator is a microstrip resonator defined on a surface of the resonator chip.
23. The magnetic resonance apparatus of embodiment 1, wherein the resonator is a three-dimensional cavity.
24. The magnetic resonance apparatus of embodiment 1, wherein the resonator is configured to operate in a primary magnetic field of a probeless magnetic resonance system.
25. The magnetic resonance apparatus of embodiment 1, wherein the resonator is configured to operate on a probe in a primary magnetic field of a magnetic resonance system.
26. The magnetic resonance apparatus of embodiment 1, wherein translation of the sample holder relative to the resonator comprises translation of the sample holder along multiple axes.
27. A magnetic resonance system comprising:
    a primary magnet system configured to generate a primary magnetic field;
    a resonator configured to interact with a sample in a sample region;
    a sample holder comprising a plurality of sample containers; and
    a sample transfer device that translates the sample holder relative to the resonator to position any one of the sample containers in the sample region.

28. The magnetic resonance system of embodiment 27, wherein the sample transfer device comprises a sample transfer rod.
29. The magnetic resonance system of embodiment 27, comprising a probe, wherein the probe comprises the resonator.
30. The magnetic resonance system of embodiment 29, comprising a cryogenic system that controls a cryogenic thermal environment of the resonator, wherein the sample transfer rod extends from outside the cryogenic thermal environment to inside the cryogenic thermal environment.
31. The magnetic resonance system of embodiment 30, wherein the plurality of sample containers reside in the cryogenic thermal environment.
32. The magnetic resonance system of embodiment 27, wherein the sample transfer device is operable to translate the sample holder relative to the resonator to maximize a filling factor of any one of the sample containers relative to the other sample containers.
33. The magnetic resonance system of embodiment 27, wherein at least one sample container of the plurality of sample containers contains a calibration sample.
34. The magnetic resonance system of embodiment 27, wherein the plurality of sample containers comprises a plurality of channels defined in the sample holder.
35. The magnetic resonance apparatus of embodiment 27, wherein each sample container comprises a sample cavity and a fill port that is offset from and fluidly coupled to the sample cavity by a sample channel.
36. The magnetic resonance apparatus of embodiment 35, wherein each sample container comprises an air escape port that is offset from the sample cavity on a side opposite the fill port and is fluidly coupled to the sample cavity by an air escape channel.
37. The magnetic resonance apparatus of embodiment 36, wherein the fill port is sized to receive a pipette tip.
38. The magnetic resonance apparatus of embodiment 36, wherein a sealant is applied to the fill port and the air escape port.
39. The magnetic resonance system of embodiment 27, wherein each of the plurality of sample containers comprises a surface that is contoured to match a spatial distribution of a resonator control field produced by the resonator.
40. The magnetic resonance system of embodiment 27, wherein the sample transfer device is operable to transfer the sample holder linearly in a first direction, and the sample containers are spaced apart from each other in the first direction.
41. The magnetic resonance system of embodiment 27, wherein the sample transfer device comprises a first end that is exposed to room temperature and a second end that is exposed to cryogenic temperature during operation.
42. The magnetic resonance system of embodiment 27, wherein the sample transfer device is configured to translate the sample holder along multiple axes.
43. A magnetic resonance sample changer system comprising:
a sample holder comprising a plurality of sample containers, at least one of the sample containers comprising a calibration sample, the sample holder being configured to move relative to a resonator in a primary magnetic field of a magnetic resonance system;
wherein the sample holder is configured to mechanically couple with an actuator that positions the sample holder relative to a reference position determined by magnetic resonance measurement of the calibration sample.
44. The magnetic resonance sample changer system of embodiment 43, comprising the actuator.
45. The magnetic resonance sample changer system of embodiment 44, comprising a sample transfer arm that mechanically couples the sample holder to the actuator.
46. The magnetic resonance sample changer system of embodiment 44, wherein the actuator comprises at least one of a servo, caliper, or micrometer.
47. The magnetic resonance sample changer system of embodiment 44, comprising a position control system that controls the actuator.
48. The magnetic resonance sample changer system of embodiment 43, wherein the plurality of sample containers comprises a plurality of channels defined in the sample holder.
49. The magnetic resonance apparatus of embodiment 48, wherein each sample container comprises a sample cavity and a fill port that is offset from and fluidly coupled to the sample cavity by a sample channel.
50. The magnetic resonance apparatus of embodiment 49, wherein each sample container comprises an air escape port that is offset from the sample cavity on a side opposite the fill port and is fluidly coupled to the sample cavity by an air escape channel.
51. The magnetic resonance apparatus of embodiment 50, wherein the fill port is sized to receive a pipette tip.
52. The magnetic resonance apparatus of embodiment 50, wherein a sealant is applied to the fill port and the air escape port.
53. The magnetic resonance sample changer system of embodiment 43, wherein each of the plurality of sample containers comprises a surface that is contoured to match a spatial distribution of a resonator control field produced by the resonator.
54. The magnetic resonance sample changer system of embodiment 43, wherein the sample holder comprises a cover slip that encloses the plurality of channels.
55. The magnetic resonance sample changer system of embodiment 43, wherein the cover slip defines ports that provide fluid communication to the plurality of channels.
56. The magnetic resonance sample changer system of embodiment 43, wherein the port comprise plugs.
57. The magnetic resonance sample changer system of embodiment 43, wherein the sample containers are spaced apart from each other in a first direction.
58. The magnetic resonance sample changer system of embodiment 43, wherein the sample holder comprises an elongated prismatic body defining a plurality of planar exterior surfaces, and the sample containers comprise channels defined in one of the plurality of planar exterior surfaces.
59. The magnetic resonance sample changer system of embodiment 43, wherein the sample holder comprises an elongated cylindrical body defining a lateral surface, and the sample containers comprise channels defined in the lateral surface.

The magnetic resonance sample changer system of embodiment 43, wherein the plurality of sample containers comprises a plurality of capillary tubes in the sample holder.

60. A magnetic resonance method comprising:
- receiving a sample holder into a resonator package, the resonator package disposed in a primary magnetic field of a magnetic resonance system, the resonator package comprising a resonator configured to interact with a sample in a sample region, the sample holder comprising a first sample and a calibration sample;
- translating the sample holder to position the calibration sample in the sample region;
- calibrating the position of the sample holder relative to the resonator based on first magnetic resonance signals generated by an interaction between the resonator and the calibration sample;
- after calibrating the position of the sample holder, translating the sample holder to position the first sample in the sample region; and
- acquiring magnetic resonance data based on second magnetic resonance signals generated by an interaction between the resonator and the first sample.

61. The magnetic resonance method of embodiment 60, wherein the sample holder comprises a plurality of additional samples, and the method comprises iteratively:
- translating the sample holder to position one of the plurality of additional samples in the sample region; and
- acquiring magnetic resonance data based on magnetic resonance signals generated by an interaction between the resonator and the sample currently positioned in the sample region.

62. The magnetic resonance method of embodiment 60, comprising cooling the sample holder to a cryogenic temperature before calibrating the position of the sample holder.

63. The magnetic resonance method of embodiment 60, wherein translating the sample holder comprises linearly translating the sample holder.

64. The magnetic resonance method of embodiment 60, wherein translating the sample holder comprises translating the sample holder along multiple axes.

65. The magnetic resonance method of embodiment 60, wherein the magnetic resonance system is the magnetic resonance system of any one of claims 23 through 34.

66. A magnetic resonance system comprising:
- a primary magnet system configured to generate a primary magnetic field;
- a resonator configured to interact with a sample in a sample region;
- a sample holder comprising a plurality of sample containers; and
- a sample transfer device that translates the sample holder relative to the resonator to position any one of the sample containers in the sample region.

67. The magnetic resonance system of embodiment 66, wherein the sample transfer device comprises a sample transfer rod.

68. The magnetic resonance system of embodiment 67, comprising a cryogenic system that controls a cryogenic thermal environment of the resonator, wherein the sample transfer rod extends from outside the cryogenic thermal environment to inside the cryogenic thermal environment.

69. The magnetic resonance system of embodiment 68, wherein the plurality of sample containers reside in the cryogenic thermal environment.

70. The magnetic resonance system of any one of embodiments 66-69, wherein the sample transfer device is operable to translate the sample holder relative to the resonator to maximize a filling factor of any one of the sample containers relative to the other sample containers.

71. The magnetic resonance system of any one of embodiments 66-69, wherein at least one sample container of the plurality of sample containers contains a calibration sample.

72. The magnetic resonance system of any one of embodiments 66-69, wherein:
- introduction of the sample holder to a field of the resonator induces a shift in a resonance frequency of the resonator; and
- the shift in the resonance frequency indicates a position of the sample holder relative to the resonator.

73. The magnetic resonance system of any one of embodiments 66-69, wherein each sample container comprises:
- a sample cavity and a fill port that is fluidly coupled to the sample cavity; and
- an air escape port that is fluidly coupled to the sample cavity.

74. The magnetic resonance system of embodiment 73, wherein the sample holder comprises:
- a first layer having a first plurality of etches formed in a planar surface thereof;
- a second layer having a second plurality of etches formed in a planar surface thereof, wherein the first plurality of etches and the second plurality of etches align to form the sample containers.

75. The magnetic resonance system of embodiment 73, comprising:
- a first layer having a first plurality of etches formed through a full thickness of the first layer;
- a second layer having a second plurality of etches formed through a full thickness of the second layer
- a third layer;
- wherein, when the first layer, the second layer, and the third layer are arranged such that the first plurality of etches and the second plurality of etches align to form the sample containers.

76. The magnetic resonance system of embodiment 73, wherein:
- the fill port is offset from the sample cavity and fluidly coupled to the sample cavity by a sample channel; and
- the air escape port is offset from the sample cavity on a side opposite the fill port and is fluidly coupled to the sample cavity by an air escape channel.

77. The magnetic resonance system of embodiment 76, comprising:
- an adhesive port formed in one of the first layer or the second layer;
- an adhesive vent formed in one of the first layer or the second layer; and
- an adhesive channel that fluidly couples the adhesive port to the adhesive vent and defines a fluid path surrounding each of the sample cavities.

78. The magnetic resonance system of any one of embodiments 66-69, wherein the sample holder comprises an elongated prismatic body defining a plurality of planar exterior surfaces, and the sample containers comprise channels defined in one of the plurality of planar exterior surfaces.

79. The magnetic resonance system of any one of embodiments 66-69, wherein the sample holder comprises an elongated cylindrical body defining a lateral surface, and the sample containers comprise channels defined in the lateral surface.
80. The magnetic resonance system of any one of embodiments 66-69, wherein the plurality of sample containers comprises a plurality of capillary tubes in the sample holder.
81. The magnetic resonance system of any one of embodiments 66-69, comprising a resonator package that includes the resonator, wherein the sample holder is at least partially disposed within the resonator package, and the resonator package comprises a positioning guide that facilitates alignment of the sample holder with the resonator.
82. The magnetic resonance system of any one of embodiments 66-69, comprising a resonator chip, wherein the resonator is a planar microstrip resonator defined on a surface of the resonator chip.
83. A magnetic resonance method comprising:
   receiving a sample holder comprising a plurality of samples into a resonator package, the resonator package disposed in a primary magnetic field of a magnetic resonance system, the resonator package comprising a resonator configured to interact with a sample in a sample region;
   based on signals received from the resonator, calibrating a position of the sample holder relative to the resonator;
   based on the calibration, translating the sample holder to position in the sample region a select sample, of the plurality of samples; and
   acquiring magnetic resonance data based on magnetic resonance signals generated by an interaction between the resonator and the select sample.
84. The magnetic resonance method of embodiment 83, comprising:
   translating the sample holder to position a calibration sample contained in the sample holder in the sample region;
   calibrating the position of the sample holder relative to the resonator based on magnetic resonance signals generated by an interaction between the resonator and the calibration sample.
85. The magnetic resonance method of embodiment 84, wherein the sample holder comprises a plurality of additional samples, and the method comprises iteratively:
   translating the sample holder to position one of the plurality of additional samples in the sample region; and
   acquiring magnetic resonance data based on magnetic resonance signals generated by an interaction between the resonator and the sample currently positioned in the sample region.
86. The magnetic resonance method of embodiment 83, wherein calibrating the position of the sample holder comprises:
   detecting a shift in a resonance frequency of the resonator, the shift in the resonance frequency resulting from an interaction between the sample holder and a field of the resonator; and
   based on the detected shift in the resonance frequency, determining a position of the sample holder relative to the resonator.
87. The magnetic resonance method of embodiment 83, comprising cooling the sample holder to a cryogenic temperature before calibrating the position of the sample holder.
88. A magnetic resonance apparatus, comprising:
   a resonator;
   a sample holder comprising a plurality of sample containers; and
   a sample transfer device operable to translate the sample holder relative to the resonator to position any one of the sample containers in a sample region of the resonator.
89. The magnetic resonance apparatus of embodiment 88, wherein the sample transfer device comprises a sample transfer rod.
90. The magnetic resonance apparatus of embodiment 89, comprising a cryogenic system that controls a cryogenic thermal environment of the resonator, wherein the sample transfer rod extends from outside the cryogenic thermal environment to inside the cryogenic thermal environment.
91. The magnetic resonance apparatus of embodiment 90, wherein the plurality of sample containers reside in the cryogenic thermal environment.
92. The magnetic resonance apparatus of any one of embodiments 88-91, wherein the sample transfer device is operable to translate the sample holder relative to the resonator to maximize a filling factor of any one of the sample containers relative to the other sample containers.
93. The magnetic resonance apparatus of any one of embodiments 88-91, wherein at least one sample container of the plurality of sample containers contains a calibration sample.
94. The magnetic resonance apparatus of any one of embodiments 88-91, wherein:
   introduction of the sample holder to a field of the resonator induces a shift in a resonant frequency of the resonator; and
   the shift in the resonant frequency indicates a position of the sample holder relative to the resonator.

What is claimed is:
1. An electron spin resonance (ESR) system comprising:
   a primary magnet system configured to generate a primary magnetic field;
   a resonator configured to interact with an ESR sample in a sample region;
   a sample holder comprising a plurality of sample containers;
   a sample transfer device that translates the sample holder in a linear fashion relative to the resonator to position any one of the sample containers in the sample region; and
   a cryogenic system that controls a cryogenic thermal environment of the resonator.
2. The ESR system of claim 1, wherein the sample transfer device comprises a sample transfer rod.
3. The ESR system of claim 2, wherein the sample transfer rod extends from outside the cryogenic thermal environment to inside the cryogenic thermal environment.
4. The ESR system of claim 3, wherein the plurality of sample containers reside in the cryogenic thermal environment.
5. The ESR system of claim 1, wherein the sample transfer device is operable to translate the sample holder relative to the resonator to maximize a filling factor of any one of the sample containers relative to the other sample containers.

6. The ESR system of claim 1, wherein at least one sample container of the plurality of sample containers contains a calibration sample.

7. The ESR system of claim 1, wherein:
introduction of the sample holder to a field of the resonator induces a shift in a resonance frequency of the resonator; and
the shift in the resonance frequency indicates a position of the sample holder relative to the resonator.

8. The ESR system of claim 1, wherein each sample container comprises:
a sample cavity and a fill port that is fluidly coupled to the sample cavity; and
an air escape port that is fluidly coupled to the sample cavity.

9. The ESR system of claim 8, wherein the sample holder comprises:
a first layer having a first plurality of etches formed in a planar surface thereof; and
a second layer having a second plurality of etches formed in a planar surface thereof, wherein the first plurality of etches and the second plurality of etches align to form the sample containers.

10. The ESR system of claim 8, comprising:
a first layer having a first plurality of etches formed through a full thickness of the first layer;
a second layer having a second plurality of etches formed through a full thickness of the second layer;
a third layer; and
wherein, when the first layer, the second layer, and the third layer are arranged such that the first plurality of etches and the second plurality of etches align to form the sample containers.

11. The ESR system of claim 9, wherein:
the fill port is offset from the sample cavity and fluidly coupled to the sample cavity by a sample channel; and
the air escape port is offset from the sample cavity on a side opposite the fill port and is fluidly coupled to the sample cavity by an air escape channel.

12. The ESR system of claim 11, comprising:
an adhesive port formed in one of the first layer or the second layer;
an adhesive vent formed in one of the first layer or the second layer; and
an adhesive channel that fluidly couples the adhesive port to the adhesive vent and defines a fluid path surrounding each of the sample cavities.

13. The ESR system of claim 1, wherein the sample holder comprises an elongated prismatic body defining a plurality of planar exterior surfaces, and the sample containers comprise channels defined in one of the plurality of planar exterior surfaces.

14. The ESR system of claim 1, wherein the sample holder comprises an elongated cylindrical body defining a lateral surface, and the sample containers comprise channels defined in the lateral surface.

15. The ESR system of claim 1, wherein the plurality of sample containers comprises a plurality of capillary tubes in the sample holder.

16. The ESR system of claim 1, comprising a resonator package that includes the resonator, wherein the sample holder is at least partially disposed within the resonator package, and the resonator package comprises a positioning guide that facilitates alignment of the sample holder with the resonator.

17. The ESR system of claim 1, comprising a resonator chip, wherein the resonator is a planar microstrip resonator defined on a surface of the resonator chip.

18. An electron spin resonance (ESR) method comprising:
receiving a sample holder comprising a plurality of ESR samples into a resonator package, the resonator package disposed in a primary magnetic field of a magnetic resonance system, the resonator package comprising a resonator configured to interact with an ESR sample in a sample region;
cooling the sample holder to a cryogenic temperature;
based on signals received from the resonator, calibrating a position of the sample holder relative to the resonator;
based on the calibration, translating the sample holder in a linear fashion to position in the sample region a select ESR sample, of the plurality of ESR samples; and
acquiring magnetic resonance data based on magnetic resonance signals generated by an interaction between the resonator and the select ESR sample.

19. The ESR method of claim 18, comprising:
translating the sample holder to position a calibration sample contained in the sample holder in the sample region; and
calibrating the position of the sample holder relative to the resonator based on magnetic resonance signals generated by an interaction between the resonator and the calibration sample.

20. The ESR method of claim 19, wherein the sample holder comprises a plurality of additional ESR samples, and the method comprises iteratively:
translating the sample holder in a linear fashion to position one of the plurality of additional ESR samples in the sample region; and
acquiring magnetic resonance data based on magnetic resonance signals generated by an interaction between the resonator and the ESR sample currently positioned in the sample region.

21. The ESR method of claim 18, wherein calibrating the position of the sample holder comprises:
detecting a shift in a resonance frequency of the resonator, the shift in the resonance frequency resulting from an interaction between the sample holder and a field of the resonator; and
based on the detected shift in the resonance frequency, determining a position of the sample holder relative to the resonator.

22. An electron spin resonance (ESR) apparatus, comprising:
a resonator configured to operate in a cryogenic thermal environment;
a sample holder comprising a plurality of sample containers; and
a sample transfer device operable to translate the sample holder in a linear fashion relative to the resonator to position any one of the sample containers in a sample region of the resonator.

23. The ESR apparatus of claim 22, wherein the sample transfer device comprises a sample transfer rod.

24. The ESR apparatus of claim 23, comprising a cryogenic system that controls the cryogenic thermal environment of the resonator, wherein the sample transfer rod extends from outside the cryogenic thermal environment to inside the cryogenic thermal environment.

25. The ESR apparatus of claim 24, wherein the plurality of sample containers reside in the cryogenic thermal environment.

26. The ESR apparatus of claim 22, wherein the sample transfer device is operable to translate the sample holder relative to the resonator to maximize a filling factor of any one of the sample containers relative to the other sample containers.

27. The ESR apparatus of claim 22, wherein at least one sample container of the plurality of sample containers contains a calibration sample.

28. The ESR apparatus of claim 22, wherein:
introduction of the sample holder to a field of the resonator induces a shift in a resonant frequency of the resonator; and
the shift in the resonant frequency indicates a position of the sample holder relative to the resonator.

* * * * *

UNITED STATES PATENT AND TRADEMARK OFFICE
CERTIFICATE OF CORRECTION

PATENT NO. : 12,092,711 B2
APPLICATION NO. : 18/235591
DATED : September 17, 2024
INVENTOR(S) : Ou et al.

It is certified that error appears in the above-identified patent and that said Letters Patent is hereby corrected as shown below:

In the Specification

Column 8, Detailed Description, Line 25 Delete "404," and insert -- 406, -- therefor Column 12, Detailed Description, Line 26 Delete "504" and insert -- 802 -- therefor Column 15, Detailed Description, Line 6 Delete "e eff." and insert -- $\epsilon_{eff}$ -- therefor Column 18, Detailed Description, Line 2 Delete "1212" and insert -- 1214 -- therefor Column 18, Detailed Description, Line 42 Delete "1412;" and insert -- 1414; -- therefor Column 19, Detailed Description, Line 53 Delete "1502" and insert -- 1501 -- therefor Column 32, Detailed Description, Line 39 After "layer" insert -- ; --

Signed and Sealed this
Nineteenth Day of November, 2024

Katherine Kelly Vidal
*Director of the United States Patent and Trademark Office*